(12) United States Patent
Kim et al.

(10) Patent No.: US 8,576,638 B2
(45) Date of Patent: Nov. 5, 2013

(54) NON-VOLATILE MEMORY DEVICE AND NON-VOLATILE MEMORY SYSTEM HAVING THE SAME

(75) Inventors: Hyung-Gon Kim, Hwaseong-si (KR);
Hyuk-Jun Yoo, Hwaseong-si (KR);
Youn-Yeol Lee, Seoul (KR);
Soo-Woong Lee, Seoul (KR);
Kyung-Min Kim, Hwaseong-si (KR)

(73) Assignee: Samsung Electronics Co., Ltd., Samsung-ro, Yeongtong-gu, Suwon-si, Gyeonggi-do (KR)

(*) Notice: Subject to any disclaimer, the term of this patent is extended or adjusted under 35 U.S.C. 154(b) by 218 days.

(21) Appl. No.: 13/095,159

(22) Filed: Apr. 27, 2011

(65) Prior Publication Data

US 2011/0267899 A1    Nov. 3, 2011

(30) Foreign Application Priority Data

Apr. 29, 2010   (KR) .................. 10-2010-0039909

(51) Int. Cl.
*G11C 7/10* (2006.01)
(52) U.S. Cl.
USPC .................. 365/189.05; 365/200; 365/185.33
(58) Field of Classification Search
USPC .................. 365/189.05, 200, 185.33, 189.08,
365/189.2, 223, 191, 185.23, 185.29,
365/230.04
See application file for complete search history.

(56) References Cited

U.S. PATENT DOCUMENTS

| | | | |
|---|---|---|---|
| 6,282,121 B1* | 8/2001 | Cho et al. | 365/185.22 |
| 2006/0044934 A1* | 3/2006 | Wong et al. | 365/239 |
| 2007/0019483 A1* | 1/2007 | Lee et al. | 365/200 |
| 2007/0076497 A1* | 4/2007 | Chae et al. | 365/207 |

FOREIGN PATENT DOCUMENTS

| | | |
|---|---|---|
| JP | 2009-123298 A | 6/2009 |
| KR | 10-0694978 B1 | 3/2007 |
| KR | 10-0765786 B1 | 10/2007 |

* cited by examiner

*Primary Examiner* — Dang Nguyen
(74) *Attorney, Agent, or Firm* — Muir Patent Consulting, PLLC

(57) ABSTRACT

A non-volatile memory device may include a memory cell array, a page buffer, a column decoder, a column selection circuit and a repair circuit. The memory cell array includes normal memory cells and redundancy memory cells. In one example, the page buffer may load normal data and redundancy data from the memory cell array. The column decoder may generate a normal column selection signal and a redundancy column selection signal in response to a column address. The column selection circuit may select the normal data and redundancy data in response to the normal column selection signal and redundancy column selection signal. The repair circuit may then output one of the normal data and redundancy data.

22 Claims, 17 Drawing Sheets

NON-VOLATILE MEMORY DEVICE AND NON-VOLATILE MEMORY SYSTEM HAVING THE SAME

CROSS-REFERENCE TO RELATED APPLICATION(S)

This application claims priority under 35 USC §119 to Korean Patent Application No. 2010-0039909, filed on Apr. 29, 2010 in the Korean Intellectual Property Office (KIPO), the contents of which are herein incorporated by reference in their entirety.

BACKGROUND

1. Technical Field

Example embodiments relate to a memory device, and more particularly to a non-volatile memory device and a non-volatile memory system including a non-volatile memory device.

2. Description of the Related Art

A semiconductor memory device is generally classified into a volatile memory device and a non-volatile memory device depending on whether stored data is retained when power is interrupted. The non-volatile memory device may include for example, a mask read-only memory (MROM), a programmable read-only memory (PROM), an erasable programmable read-only memory (EPROM), an electrically erasable programmable read-only memory (EEPROM), a flash memory device, etc.

Speeds of a reading operation and a writing operation are relatively fast in the volatile memory device but stored data is not retained when power is interrupted. On the other hand, speeds of a reading operation and a writing operation are relatively slow in the non-volatile memory device but stored data is retained when power is interrupted. Therefore, the non-volatile memory is generally used when a fast operation is not required and stored data should be retained even though power is interrupted.

However, as an operation frequency of a system including the non-volatile memory device increases, the non-volatile memory device is required to operate fast according to the operation frequency of the system.

SUMMARY

Example embodiments are directed to provide a non-volatile memory device that operates fast.

Example embodiments are directed to provide a non-volatile memory system that includes a non-volatile memory device which operates fast. A method of operating memory is also disclosed.

According to one embodiment, a non-volatile memory device is disclosed. The non-volatile memory device includes a memory cell array, a row decoder, a page buffer, a column decoder, a repair control circuit, a column selection circuit and a repair circuit. The memory cell array includes normal memory cells and redundancy memory cells, the normal memory cells and the redundancy memory cells are arranged in rows and in columns and coupled to normal bit lines and redundancy bit lines, respectively. The row decoder is configured to select a row including a first set of the normal memory cells and a first set of the redundancy memory cells in response to a first row address. The page buffer is configured to load normal data through the corresponding normal bit lines from the selected first set of the normal memory cells, and to load redundancy data through the corresponding redundancy bit lines from the selected first set of redundancy memory cells. The column decoder is configured to generate a normal column selection signal and a redundancy column selection signal in response to a first column address. The repair control circuit is configured to generate a column repair signal in response to the redundancy column selection signal. The column selection circuit is configured to select normal data and redundancy data from the page buffer in response to the normal column selection signal and the redundancy column selection signal, respectively. The repair circuit is configured to receive the selected normal data and selected redundancy data at first and second inputs, respectively, and to transmit one of the selected normal data and the selected redundancy data during at least two consecutive clock cycles of an internal clock signal in response to the column repair signal.

In further embodiment, a non-volatile memory device is disclosed. The non-volatile memory device includes a memory cell array, a page buffer, a column decoder, a repair control circuit, a column selection circuit and a repair circuit. The memory cell array includes normal memory cells and redundancy memory cells, the normal memory cells and the redundancy memory cells are arranged in a plurality of memory banks, and are coupled to normal bit lines and redundancy bit lines, respectively. The page buffer is configured to load a first set of normal data through the corresponding normal bit lines from the selected first set of the normal memory cells in response to a first row address, and configured to load a first set of redundancy data through the corresponding redundancy bit lines from the selected first set of redundancy memory cells in response to the first row address. The column decoder is configured to generate a first set of normal column selection signals and a first set of redundancy column selection signals in response to a first set of column addresses. The repair control circuit is configured to generate a first set of column repair signals in response to the first set of redundancy column selection signals. The column selection circuit is configured to select a first set of normal data and a first set of redundancy data in response to the first set of normal column selection signals and the first set of redundancy column selection signals, respectively. The repair circuit is configured to receive the selected first set of normal data at a first input and the selected first set of redundancy data at a second input, and configured to transmit a first set of output data selected between the selected first set of normal data and the selected first set of redundancy data sequentially during at least two consecutive clock cycles of an internal clock signal in response to the first set of column repair signals.

In another embodiment, a method of operating a memory is disclosed. The method includes receiving a first row address and reading first data from a first row of memory cells in response to the received first row address, the first data including data from normal memory cells and redundant memory cells of the first row of memory. The method further includes latching the first data in a page buffer, receiving a first column address and transmitting a first part of the first data from the page buffer in response to the first column address. The method further includes determining whether the first address corresponds to a defective location of the normal memory cells and transmitting a second part of the first data from the page buffer when it is determined that the first address corresponds to a defective location of the normal memory cells, the second part of the first data corresponding to data read from redundant memory cells. The method additionally includes selecting the second part of the first data and transmitting the second part of the first data when it is determined that the first address corresponds to a defective location of the normal memory cells. The first part and second part of the first data transmit sequentially during at least two consecutive clock cycles of an internal clock signal.

BRIEF DESCRIPTION OF THE DRAWINGS

Illustrative, non-limiting example embodiments will be more clearly understood from the following detailed description in conjunction with the accompanying drawings.

DETAILED DESCRIPTION OF THE EMBODIMENTS

Figure 1:
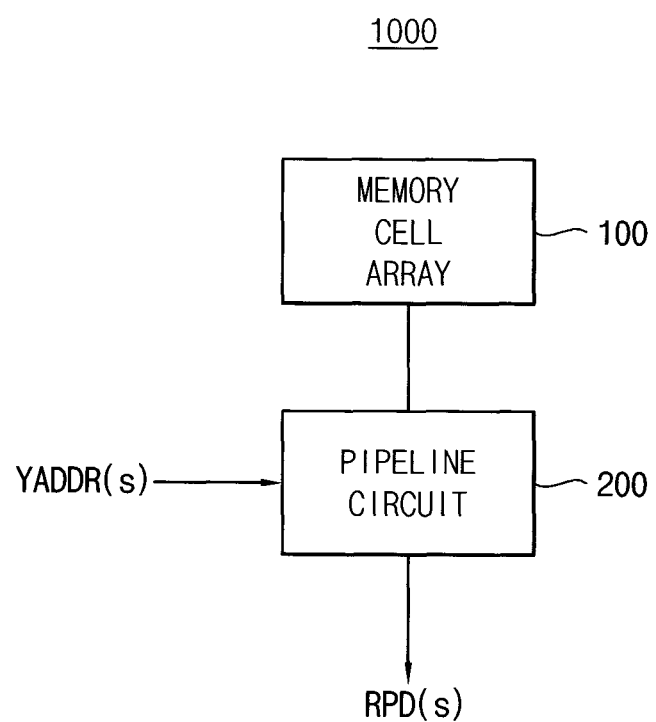
FIG. 1 is a block diagram illustrating a non-volatile memory device according to example embodiments.

Various example embodiments will be described more fully with reference to the accompanying drawings, in which some example embodiments are shown. The present inventive concept may, however, be embodied in many different forms and should not be construed as limited to the embodiments set forth herein. Like reference numerals refer to like elements throughout this application.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular embodiments and is not intended to be limiting of the inventive concept. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
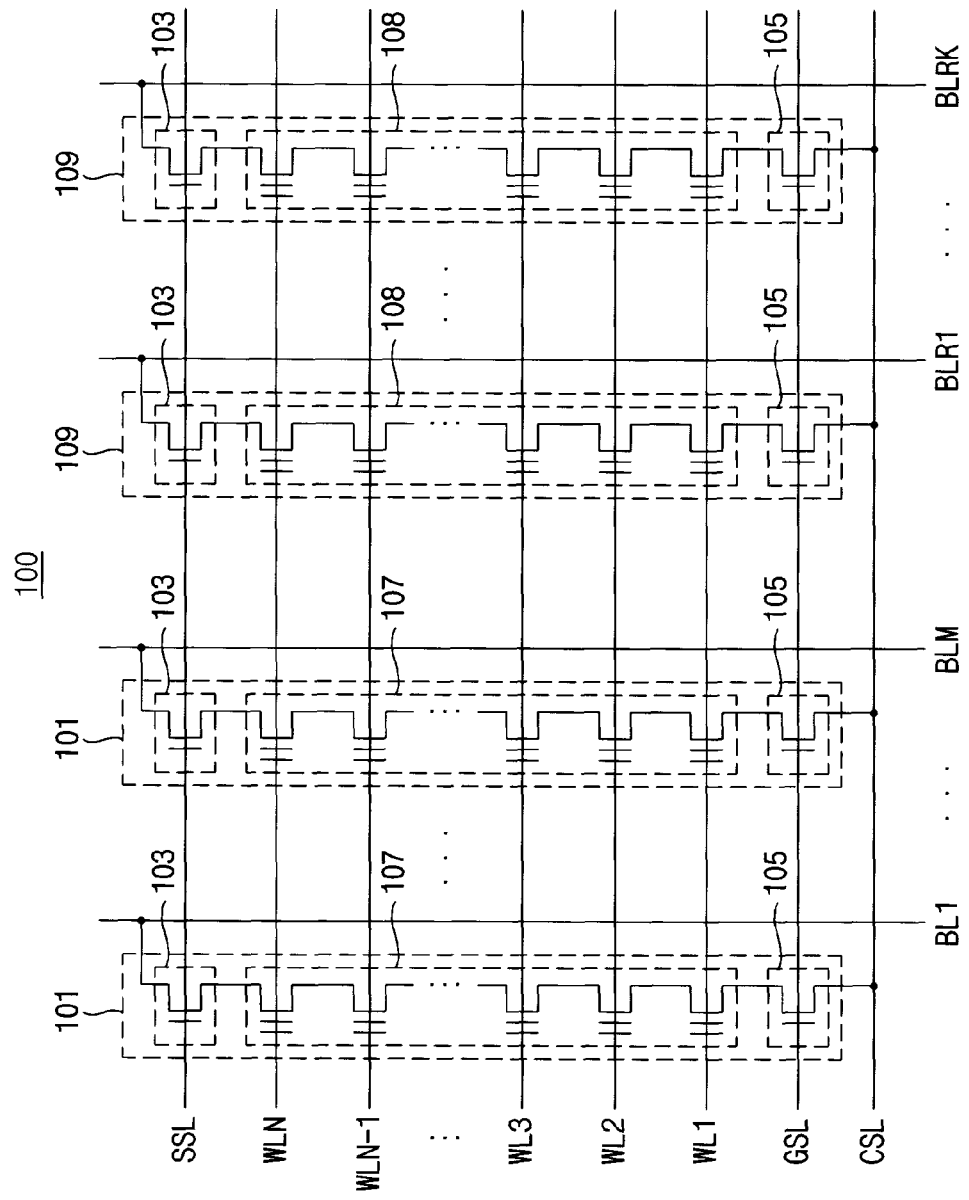
FIG. 2 is a circuit diagram illustrating an example of a memory cell array included in a non-volatile memory device of FIG. 1.

FIG. 1 is a block diagram illustrating a non-volatile memory device according to example embodiments, and FIG. 2 is a circuit diagram illustrating an example of a memory cell array included in a non-volatile memory device of FIG. 1.

Referring to FIG. 1, a non-volatile memory device 1000 includes a memory cell array 100 and a pipeline circuit 200. The memory cell array 100 includes normal memory cells and redundancy memory cells.

The memory cell array 100 may include a plurality of normal columns 101 and a plurality of redundancy columns 109 as illustrated in FIG. 2.

Each of the plurality of normal columns 101 may include a string selection transistor 103, a ground selection transistor 105 and a plurality of normal memory cells 107. Each of the plurality of redundancy columns 109 may include the string selection transistor 103, the ground selection transistor 105 and a plurality of redundancy memory cells 108. The normal memory cells 107 and the redundancy memory cells 108 may have the same structure. Drains of the string selection transistors 103 may be connected to corresponding bit lines BL1, ..., BLM and BLR1, ..., BLRK and gates of the string selection transistors 103 may be connected to a string selection line SSL. Sources of the ground selection transistors 105 may be connected to a common source line CSL and gates of the ground selection transistors 105 may be connected to a ground selection line GSL. The plurality of normal memory cells 107 may be connected in serial between the string selection transistor 103 and the ground selection transistor 105 in the plurality of normal columns 101. The plurality of redundancy memory cells 108 may be connected in serial between the string selection transistor 103 and the ground selection transistor 105 in the plurality of redundancy columns 109.

Gates of the normal memory cells 107 and gates of the redundancy memory cells 109 located in a same row may be commonly connected to corresponding word lines WL1, ..., WLN. The string selection transistors 103 may be controlled by a signal applied to the string selection line SSL. The ground selection transistors 105 may be controlled by a signal applied to the ground selection line GSL. The normal memory cells 107 and the redundancy memory cells 109 may be controlled by a signal applied to corresponding word lines WL1, ..., WLN.

The pipeline circuit 200 decodes a column address YADDR(s), loads data from the memory cell array 100 in response to the column address YADDR(s) and outputs a repair data by repairing the loaded data in a pipeline manner. The pipeline circuit 200 may receive the column address YADDR(s) corresponding to a normal column 101 to be read among the plurality of the normal columns 101, decode the column address YADDR(s), load and select data corresponding to the decoded column address YADDR(s) in a pipeline manner, repair the loaded data if the loaded data is defected and output the repaired data as a repair data RPD(s). The column address YADDR(s) may include one column address and the repair data RPD(s) may include one repair data. The column address YADDR(s) may include a plurality of column addresses and the repair data RPD(s) may include a plurality of repair data.

Figure 3:
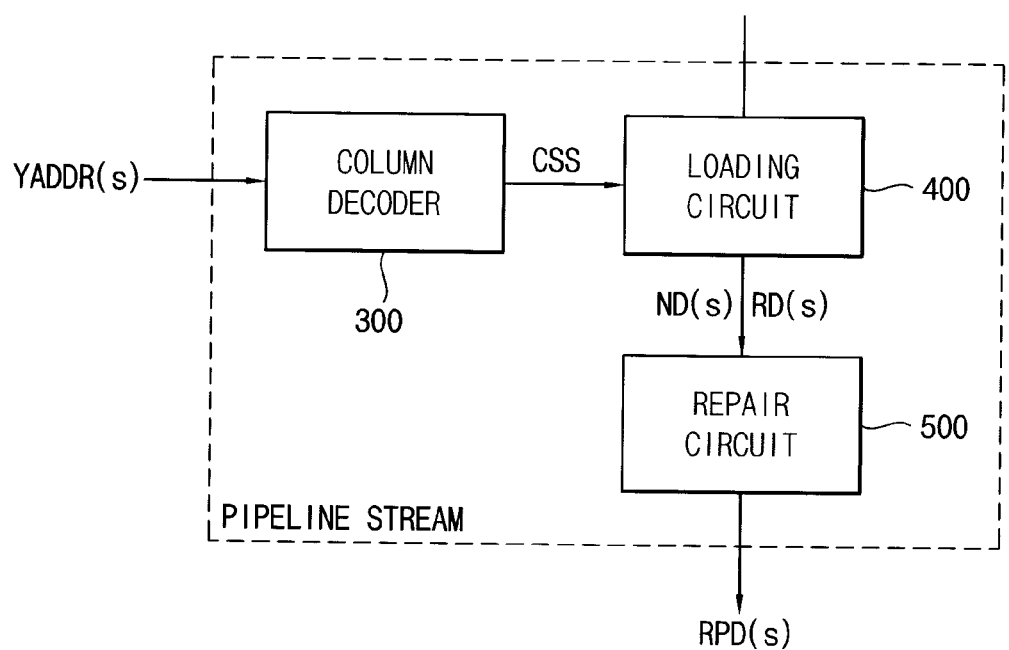
FIG. 3 is a block diagram illustrating an example of a pipeline circuit included in a non-volatile memory device of FIG. 1.

FIG. 3 is a block diagram illustrating an example of a pipeline circuit included in a non-volatile memory device of FIG. 1.

Referring to FIG. 3, the pipeline circuit 200 may include a pipeline stream having a column decoder 300, a loading circuit 400 and a repair circuit 500.

The column decoder 300 may generate a column selection signal CSS in response to the column address YADDR(s) and latch the column selection signal CSS. In this application, "latch" means "latch data and output the latched data". The loading circuit 400 may be connected to the memory cell array 100 through the bit lines BL1, ..., BLM and BLR1, ..., BLRK. The loading circuit 400 may load data from the memory cell array 100 in response to the column selection signal CSS received from the column decoder 300 and latch the loaded data ND(s) and RD(s). The repair circuit 500 may generate the repair data RPD(s) by repairing the loaded data ND(s) and RD(s) and latch the repair data RPD(s). The pipeline stream may operate in a pipeline manner such that the column decoder 300, the loading circuit 400 and the repair circuit 500 operate in a pipeline manner in that order. For example, the column decoder 300, the loading circuit 400 and the repair circuit 500 may be operated simultaneously, each being responsive to a different column address at any one time. These different column addresses may be those column addresses sequentially received by the pipeline circuit (e.g., repair circuit 500 operating with respect to column address (n), while loading circuit operates with respect to column address (n+1), while column decoder operates with respect to column address (n+2)).

Figure 4:
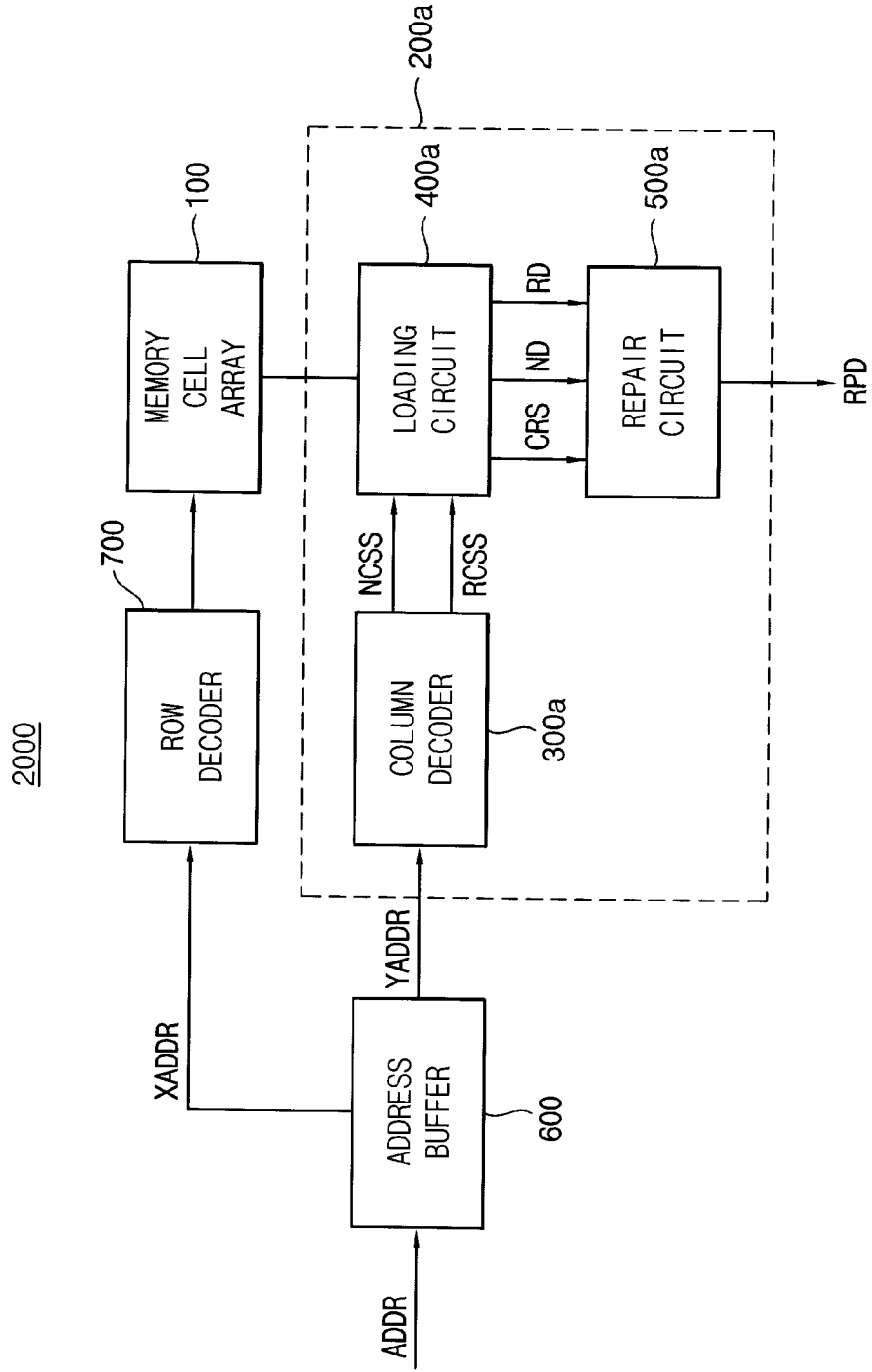
FIG. 4 is a block diagram illustrating a non-volatile memory device according to example embodiments.

FIG. 4 is a block diagram illustrating a non-volatile memory device according to example embodiments.

Referring to FIG. 4, a non-volatile memory device 2000 includes a memory cell array 100 and a pipeline circuit 200a. The non-volatile memory device 2000 may further include an address buffer 600 and a row decoder 700. The pipeline circuit 200a may include a column decoder 300a, a loading circuit 400a and a repair circuit 500a.

The memory cell array 100 included in the non-volatile memory device 2000 of FIG. 4 may have the same structure as the memory cell array 100 included in the non-volatile memory device 1000 of FIG. 1. Thus, a detailed description of the memory cell array 100 included in the non-volatile memory device 2000 will be omitted.

The address buffer 600 may receive address ADDR corresponding to a memory cell to be accessed. The address buffer 600 may generate a row address XADDR in response to the address ADDR and provide the row address XADDR to the row decoder 700. The address buffer 600 may generate a column address YADDR in response to the address ADDR and provide the column address YADDR to the pipeline circuit 200a.

The row decoder 700 may be connected to the memory cell array 100 through the string selection line SSL, the ground selection line GSL and word lines WL1, ..., WLN. The row decoder 700 may select one of the word lines WL1, ..., WLN to which the memory cell to be accessed is connected in response to the row address XADDR.

The column decoder 300a may generate a normal column selection signal NCSS, which represents one of the bit lines BL1, ..., BLM to which a normal column 101 including a normal memory cell to be accessed is connected, in response to the column address YADDR and latch the normal column selection signal NCSS. The column decoder 300a may determine whether the column address YADDR corresponds to a normal column 101 having a defect. If the column decoder 300a determines that the column address YADDR corresponds to the normal column 101 having a defect, the column decoder 300a may generate a redundancy column selection signal RCSS, which represents one of the bit lines BLR1, ..., BLRK to which a redundancy column 109 corresponding to the normal column 101 having a defect is connected, and latch the redundancy column selection signal RCSS. If the column decoder 300a determines that the column address YADDR does not correspond to the normal column 101 having a defect, the column decoder 300a may generate the redundancy column selection signal RCSS having a predetermined value indicating that the column address YADDR does not correspond to the normal column 101 having a defect. For example, if the column decoder 300a determines that the column address YADDR does not correspond to the normal column 101 having a defect, the column decoder 300a may generate the redundancy column selection signal RCSS having a value of zero and latch the redundancy column selection signal RCSS. In other example embodiments, if the column decoder 300a determines that the column address YADDR does not correspond to the normal column 101 having a defect, the column decoder 300a may generate a separate control signal representing that the column address YADDR does not correspond to the normal column 101 having a defect.

The loading circuit 400a may select one of the bit lines BL1, ..., BLM to which the normal column 101 including the normal memory cell to be accessed is connected in response to the normal column selection signal NCSS, load data received from the memory cell array 100 through the selected bit line and latch the loaded data as a normal data ND. If the redundancy column selection signal RCSS does not have the predetermined value, the loading circuit 400a may select one of the bit lines BLR1, ..., BLRK to which the redundancy column 109 corresponding to the normal column 101 having a defect is connected in response to the redundancy column selection signal RCSS, load data received from the memory cell array 100 through the selected bit line and latch the loaded data as a redundancy data RD. If the redundancy column selection signal RCSS has the predetermined value, the loading circuit 400a may not load and latch any data from the redundancy memory cells since, as will be described later, the repair circuit 500a does not use the redundancy data RD to repair the normal data ND. The loading circuit 400a may generate a column repair signal CRS in response to the redundancy column selection signal RCSS. For example, the loading circuit 400a may generate the column repair signal CRS having a first value when the redundancy column selection signal RCSS indicates that the column address YADDR does not correspond to the normal column 101 having a defect and generate the column repair signal CRS having a second value when the redundancy column selection signal RCSS indicates that the column address YADDR corresponds to the normal column 101 having a defect.

The repair circuit 500a may receive the column repair signal CRS, the normal data ND and the redundancy data RD, generate the repair data RPD by repairing the normal data ND using the redundancy data RD in response to the column repair signal CRS and latch the repair data RPD.

Figure 5:
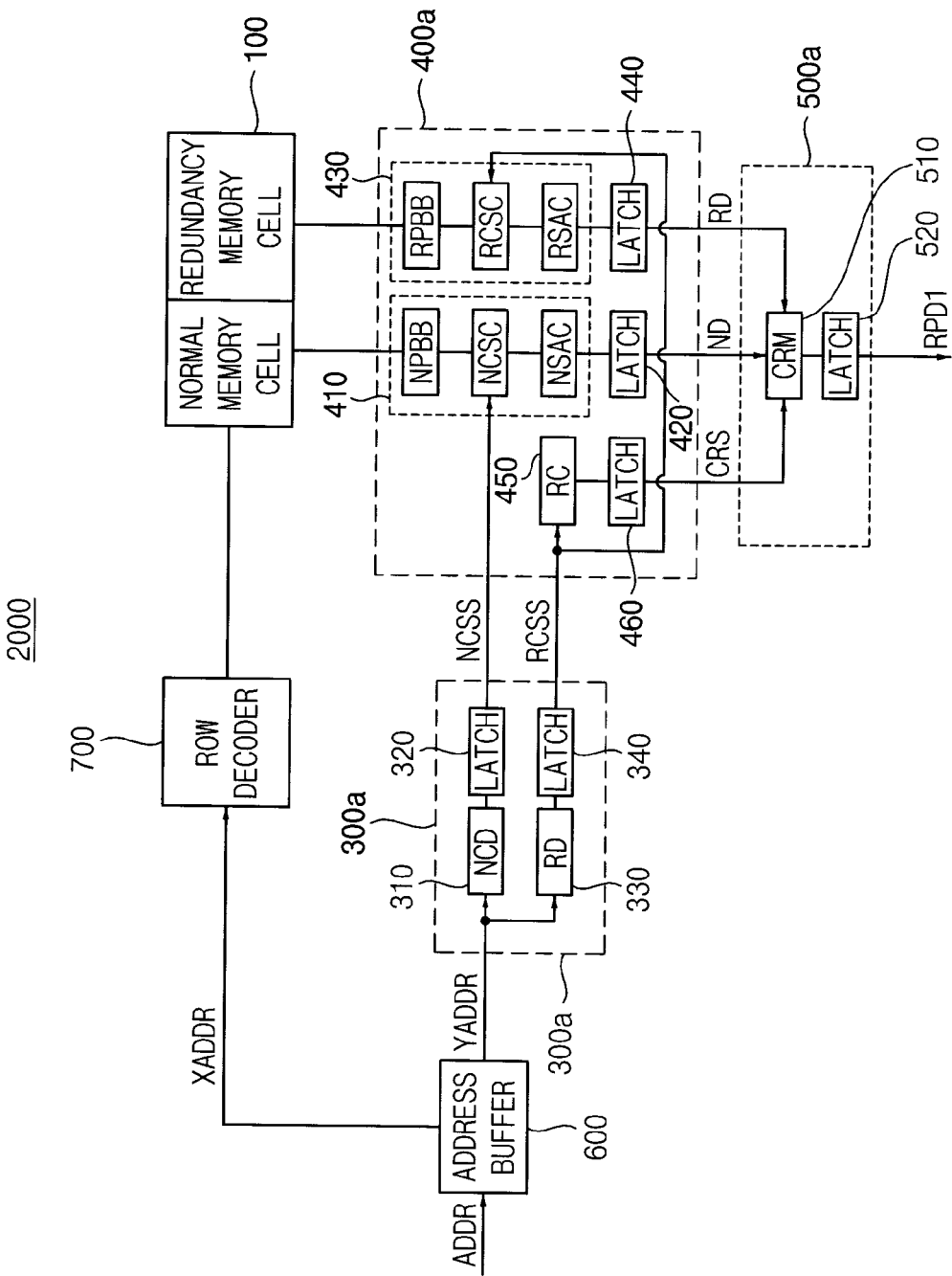
FIG. 5 is block diagram illustrating an example of a non-volatile memory device of FIG. 4.

FIG. 5 is block diagram illustrating an example of a non-volatile memory device of FIG. 4.

The column decoder 300a, the loading circuit 400a and the repair circuit 500a included in the pipeline circuit 200a of FIG. 4 are illustrated in detail in FIG. 5.

The memory cell array 100, the address buffer 600 and the row decoder 700 are described with reference to FIG. 4. Thus, a detailed description of the memory cell array 100, the address buffer 600 and the row decoder 700 will be omitted.

Referring to FIG. 5, the column decoder 300a may include a normal column decoder NCD 310, a first latch circuit 320, a repair detection circuit RD 330 and a second latch circuit 340.

The normal column decoder 310 may receive the column address YADDR from the address buffer 600 and generate the normal column selection signal NCSS.

The first latch circuit 320 may latch the normal column selection signal NCSS received from the normal column decoder 310.

The repair detection circuit 330 may determine whether the column address YADDR corresponds to the normal column 101 having a defect. If the repair detection circuit 330 determines that the column address YADDR corresponds to the normal column 101 having a defect, the repair detection circuit 330 may generate a redundancy column selection signal RCSS, which represents one of the bit lines BLR1, ..., BLRK to which a redundancy column 109 corresponding to the normal column 101 having a defect is connected.

The repair detection circuit 330 may include a plurality of fuses and store addresses of normal columns 101 having a defect as repair column addresses by selectively cutting the plurality of fuses. The repair detection circuit 330 may determine whether the column address YADDR corresponds to the normal column 101 having a defect by comparing the column address YADDR with the repair column addresses. A value of the redundancy column selection signal RCSS may be predetermined for each of the repair column addresses. Therefore, if the column address YADDR is the same as one of the repair column addresses, the repair detection circuit 330 may generate the redundancy column selection signal RCSS, which represents predetermined one of the bit lines BLR1, ..., BLRK. If the column address YADDR is not the same as any of the repair column addresses, the repair detection circuit 330 may generate the redundancy column selection signal RCSS having the predetermined value indicating that the column address YADDR does not correspond to the normal column 101 having a defect. In other example embodiments, if the column address YADDR is not the same as any of the repair column addresses, the repair detection circuit 330 may generate a separate control signal representing that the column address YADDR does not correspond to the normal column 101 having a defect.

The second latch circuit 340 may latch the redundancy column selection signal RCSS received from the repair detection circuit 330.

The loading circuit 400a may include a normal column selection unit 410, a third latch circuit 420, a redundancy column selection unit 430, a fourth latch circuit 440, a repair control circuit RC 450 and a fifth latch circuit 460.

The normal column selection unit 410 may be connected to the normal memory cells of the memory cell array 100 through the bit lines BL1, ..., BLM. The normal column selection unit 410 may select one of data provided from the normal memory cells through the bit lines BL1, ..., BLM in response to the normal column selection signal NCSS received from the first latch circuit 320 and provide the selected data as the normal data ND.

The normal column selection unit 410 may include a normal page buffer block NPBB, a normal column selection circuit NCSC and a normal sense amp circuit NSAC.

The normal page buffer block NPBB may include a plurality of normal page buffers. Each of the plurality of normal page buffers may be connected to the corresponding bit lines BL1, ..., BLM. Each of the plurality of normal page buffers may load data from the normal memory cells through the corresponding bit lines BL1, ..., BLM.

The normal column selection circuit NCSC may select a predetermined number of the normal page buffers in response to the normal column selection signal NCSS received from the first latch circuit 320 and output the loaded data of the selected normal page buffers. The predetermined number of the normal page buffers may be determined according to the number of bits included in a data line of the non-volatile memory device 2000. For example, if the non-volatile memory device 2000 outputs sixteen bits of data, the predetermined number of the normal page buffers may be sixteen.

The normal sense amp circuit NSAC may amplify data received from the normal column selection circuit NCSC to provide the normal data ND.

The third latch circuit 420 may latch the normal data ND received from the normal sense amp circuit NSAC.

The redundancy column selection unit 430 may be connected to the redundancy memory cells of the memory cell array 100 through the bit lines BLR1, ..., BLRK. The redundancy column selection unit 430 may select one of data provided from the redundancy memory cells through the bit lines BLR1, ..., BLRK in response to the redundancy column selection signal RCSS received from the second latch circuit 340 and provide the selected data as the redundancy data RD.

The redundancy column selection unit 430 may include a redundancy page buffer block RPBB, a redundancy column selection circuit RCSC and a redundancy sense amp circuit RSAC.

The redundancy page buffer block RPBB may include a plurality of redundancy page buffers. Each of the plurality of redundancy page buffers may be connected to the corresponding bit lines BLR1, ..., BLRK. Each of the plurality of redundancy page buffers may load data from the redundancy memory cells through the corresponding bit lines BLR1, ..., BLRK.

The redundancy column selection circuit RCSC may select a predetermined number of the redundancy page buffers in response to the redundancy column selection signal RCSS received from the second latch circuit 340 and output the loaded data of the selected redundancy page buffers. The redundancy column selection signal RCSS may have a predetermined value according to repair column addresses, which represent addresses of the normal columns having a defect. The predetermined value of the redundancy column selection signal RCSS may be physically coded in the redundancy column selection circuit RCSC. Therefore, the selected redundancy page buffers may be predetermined according to the predetermined value of the redundancy column selection signal RCSS. If the redundancy column selection signal RCSS indicates that the column address YADDR does not correspond to the normal column 101 having a defect, the redundancy column selection circuit RCSC may not select any redundancy page buffer since output of the redundancy column selection circuit RCSC is not used to repair the normal data ND. The predetermined number of the redundancy page buffers may be determined according to the number of bits included in the data line of the non-volatile memory device 2000. For example, if the non-volatile memory device 2000 outputs 8 bits of data, the predetermined number of the redundancy page buffers may be eight.

The redundancy sense amp circuit RSAC may amplify data received from the redundancy column selection circuit RCSC to provide the redundancy data RD.

The fourth latch circuit 440 may latch the redundancy data RD received from the redundancy sense amp circuit RSAC.

The repair control circuit 450 may generate the column repair signal CRS, which represents whether the column address YADDR corresponds to the normal column 101 having a defect, in response to the redundancy column selection signal RCSS received from the second latch circuit 340. For example, the repair control circuit 450 may generate the column repair signal CRS having a first value when the redundancy column selection signal RCSS represents that the column address YADDR does not correspond to the normal column 101 having a defect and generate the column repair signal CRS having a second value when the redundancy column selection signal RCSS represents that the column address YADDR corresponds to the normal column 101 having a defect.

The fifth latch circuit 460 may latch the column repair signal CRS received from the repair control circuit 450.

The repair circuit 500a may include a column repair multiplexer unit 510 and a sixth latch circuit 520.

The column repair multiplexer 510 may receive the normal data ND from the third latch circuit 420, receive the redundancy data RD from the fourth latch circuit 440 and receive the column repair signal CRS from the fifth latch circuit 460. The column repair multiplexer 510 may output one of the normal data ND and the redundancy data RD as the repair data RPD in response to the column repair signal CRS. The column repair multiplexer 510 may output the normal data ND when the column repair signal CRS indicates that the column address YADDR does not correspond to the normal column 101 having a defect and output the redundancy data RD when the column repair signal CRS indicates that the column address YADDR corresponds to the normal column 101 having a defect. The column repair multiplexer 510 may include a multiplexer that receives the normal data ND as a first input data, receives the redundancy data RD as a second input data and receives the column repair signal CRS as a control signal. The multiplexer may output the normal data ND when the column repair signal CRS has the first value and output the redundancy data RD when the column repair signal CRS has the second value.

The sixth latch circuit 520 may latch the repair data RPD received from the column repair multiplexer 510.

Figure 6:
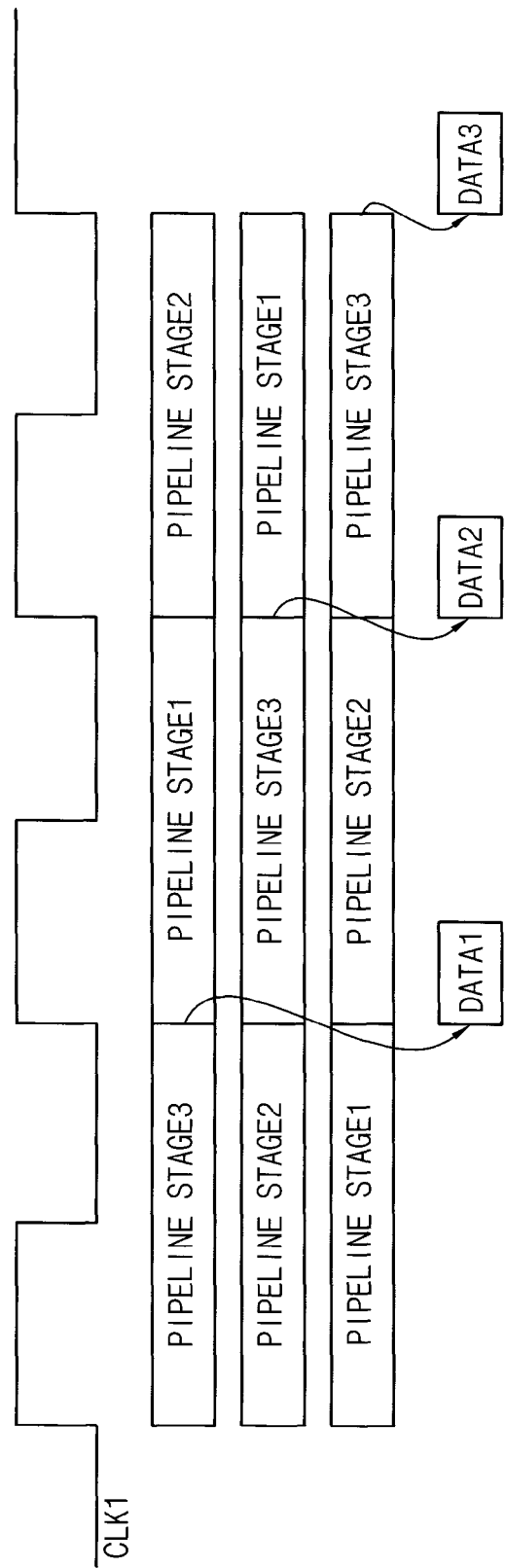
FIG. 6 is a timing diagram for describing an operation of a non-volatile memory device of FIG. 5.

FIG. 6 is a timing diagram for describing an operation of a non-volatile memory device of FIG. 5.

In FIG. 6, a clock signal CLK1 may represent a common clock signal of the first latch circuit 320, the second latch circuit 340, the third latch circuit 420, the fourth latch circuit 440, the fifth latch circuit 460 and the sixth latch circuit 520. A first pipeline stage PIPELINE STAGE 1 represents a period during which the column decoder 300a operates, a second pipeline stage PIPELINE STAGE 2 represents a period during which the loading circuit 400a operates and a third pipeline stage PIPELINE STAGE 3 represents a period during which the repair circuit 500a operates.

Referring to FIG. 6, all of the first pipeline stage, the second pipeline stage and the third pipeline stage operate simultaneously during one clock cycle. That is, the column decoder 300a generates the normal column selection signal NCSS and the redundancy column selection signal RCSS in response to the column address YADDR during one clock cycle. The loading circuit 400a generates the normal data ND in response to the normal column selection signal NCSS, generates the redundancy data RD in response to the redundancy column selection signal RCSS, generates the column repair signal CRS in response to the redundancy column selection signal RCSS and latches the normal data ND, the redundancy data RD and the column repair signal CRS during one clock cycle. The repair circuit 500a generates the repair data RPD in response to the normal data ND, the redundancy data RD and the column repair signal CRS during one clock cycle.

Therefore, the non-volatile memory device 2000 may output the repair data RPD during at least two consecutive clock cycles. As illustrated in FIG. 6, the non-volatile memory device 2000 outputs a first data DATA1 at the end of the first clock cycle, outputs a second data DATA2 at the end of the second clock cycle and outputs a third data DATA3 at the end of the third clock cycle. In other example embodiments, the first data DATA1 may be output at low-edge of the first clock cycle and the second data DATA2 may be output at high-edge of the first clock cycle.

As described above with reference to FIGS. 4, 5 and 6, the operation speed of the non-volatile memory device 2000 may be increased since the non-volatile memory device 2000 includes the pipeline circuit 200a that operates in a pipeline manner to output the repair data RPD during at least two consecutive clock cycles.

Figure 7:
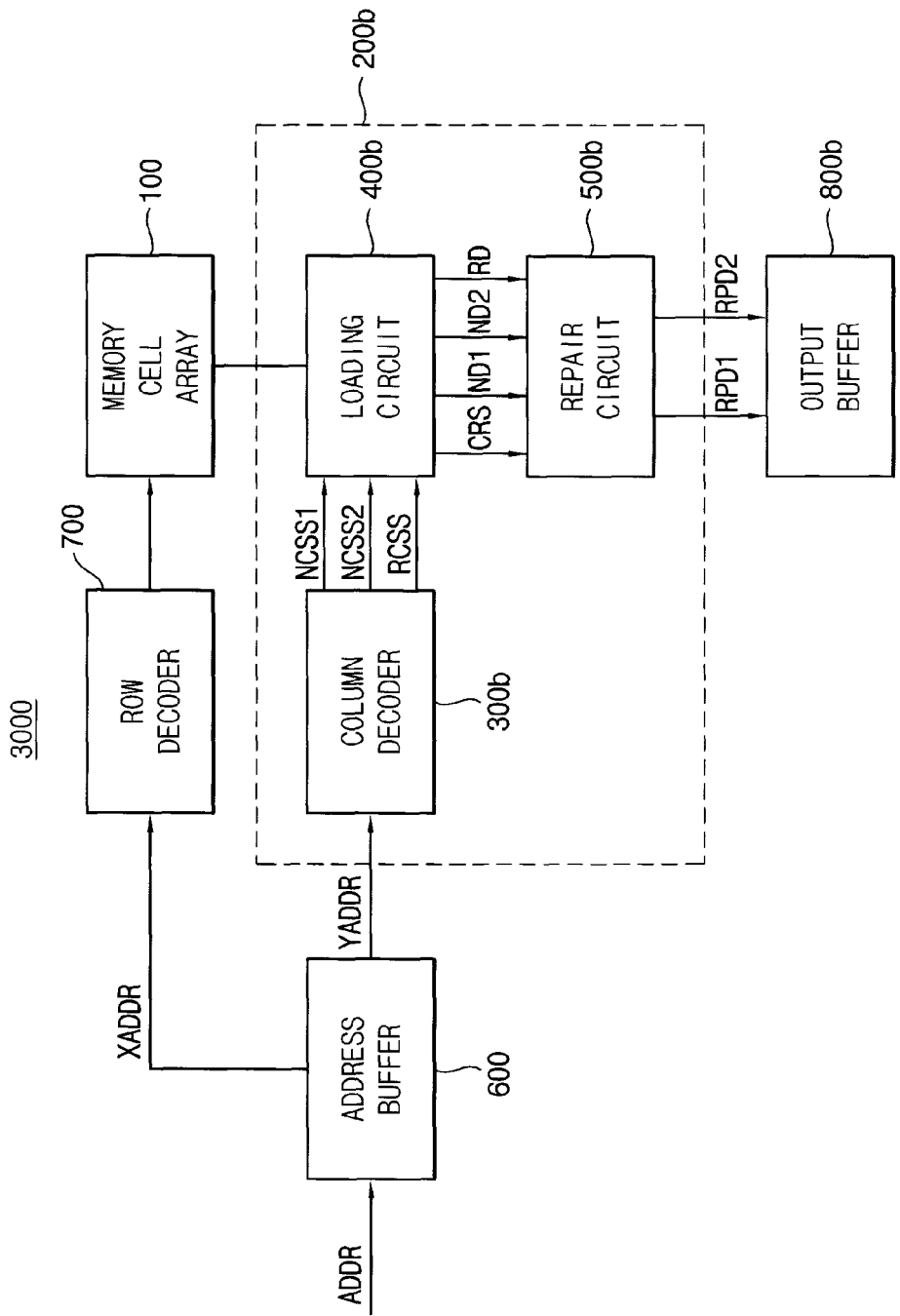
FIG. 7 is a block diagram illustrating a non-volatile memory device according to example embodiments.

FIG. 7 is a block diagram illustrating a non-volatile memory device according to example embodiments.

Referring to FIG. 7, a non-volatile memory device 3000 includes a memory cell array 100, a pipeline circuit 200b and an output buffer 800b. The non-volatile memory device 3000 may further include an address buffer 600 and a row decoder 700.

The memory cell array 100 included in the non-volatile memory device 3000 of FIG. 7 may have the same structure as the memory cell array 100 included in the non-volatile memory device 1000 of FIG. 1. The address buffer 600 and the row decoder 700 included in the non-volatile memory device 3000 of FIG. 7 may have the same structure as the address buffer 600 and the row decoder 700 included in the non-volatile memory device 2000 of FIG. 4. Thus, a detailed description of the memory cell array 100, the address buffer 600 and the row decoder 700 included in the non-volatile memory device 3000 will be omitted.

The pipeline circuit 200b may operate in a prefetch mode such that the pipeline circuit 200b simultaneously loads N data respectively corresponding to consecutive N column addresses (e.g., each of the N data being accessible by a corresponding different one of the N column addresses, such as YADDR) from the memory cell array 100 and latches the loaded N data, where N is an integer equal to or more than two.

In FIG. 7, the pipeline circuit 200b may simultaneously load two data and latches the loaded two data. However, in some other example embodiments, the pipeline circuit 200b may simultaneously load more than three data and latch the loaded data. The pipeline circuit 200b may load two data and latch the loaded data during one clock cycle.

The pipeline circuit 200b may include a column decoder 300b, a loading circuit 400b and a repair circuit 500b.

The column decoder 300b may generate a first normal column selection signal NCSS1 and a second normal column selection signal NCSS2, which represent two of the bit lines BL1, ..., BLM to which normal columns 101 including normal memory cells to be accessed are connected, in response to consecutive two column addresses starting from the column address YADDR and latch the two normal column selection signals NCSS1 and NCSS2. The column decoder 300b may determine whether any of the consecutive two column addresses corresponds to a normal column 101 having a defect. If the column decoder 300b determines that any of the consecutive two column addresses corresponds to the normal column 101 having a defect, the column decoder 300b may generate a redundancy column selection signal RCSS, which represents one of the bit lines BLR1, ..., BLRK to which a redundancy column 109 corresponding to the normal column 101 having a defect is connected, and latch the redundancy column selection signal RCSS. If the column decoder 300b determines that any of the consecutive two column addresses does not correspond to the normal column 101 having a defect, the column decoder 300b may generate the redundancy column selection signal RCSS having a predetermined value indicating that all of the consecutive two column addresses do not correspond to the normal column 101 having a defect. For example, if the column decoder 300b determines that all of the consecutive two column addresses do not correspond to the normal column 101 having a defect, the column decoder 300b may generate the redundancy column selection signal RCSS having a value of zero and latch the redundancy column selection signal RCSS. In other example embodiments, if the column decoder 300b determines that all of the consecutive two column addresses do not correspond to the normal column 101 having a defect, the column decoder 300b may generate a separate control signal representing that all of the consecutive two column addresses do not correspond to the normal column 101 having a defect.

The loading circuit 400b may select two of the bit lines BL1, ..., BLM to which the normal columns 101 including the normal memory cells to be accessed are connected in response to the two normal column selection signals NCSS1 and NCSS2, load two data received from the memory cell array 100 through the selected two bit lines and latch the loaded two data as a first normal data ND1 and a second normal data ND2. If the redundancy column selection signal RCSS does not have the predetermined value, the loading circuit 400b may select one of the bit lines BLR1, ..., BLRK to which the redundancy column 109 corresponding to the normal column 101 having a defect is connected in response to the redundancy column selection signal RCSS, load data received from the memory cell array 100 through the selected bit line and latch the loaded data as a redundancy data RD. If the redundancy column selection signal RCSS has the predetermined value, the loading circuit 400b may not load and latch any data from the redundancy memory cells since, as will be described later, the repair circuit 500b does not use the redundancy data RD to repair the first normal data ND1 and the second normal data ND2. The loading circuit 400b may generate a column repair signal CRS in response to the redundancy column selection signal RCSS. For example, the loading circuit 400b may generate the column repair signal CRS having a first value when the redundancy column selection signal RCSS indicates that all of the consecutive two column addresses do not correspond to the normal column 101 having a defect, generate the column repair signal CRS having a second value when the redundancy column selection signal RCSS indicates that the column address YADDR corresponds to the normal column 101 having a defect and generate the column repair signal CRS having a third value when the redundancy column selection signal RCSS indicates that an column address next to the column address YADDR corresponds to the normal column 101 having a defect.

The repair circuit 500b may receive the column repair signal CRS, the first normal data ND1, the second normal data ND2 and the redundancy data RD, generate a first repair data RPD1 and a second repair data RPD2 by repairing the first normal data ND1 and the second normal data ND2 using the redundancy data RD in response to the column repair signal CRS and latch the first repair data RPD1 and the second repair data RPD2.

The output buffer 800b may receive the first repair data RPD1 and the second repair data RPD2 from the repair circuit 500b and output the first repair data RPD1 and the second repair data RPD2 consecutively.

Figure 8:
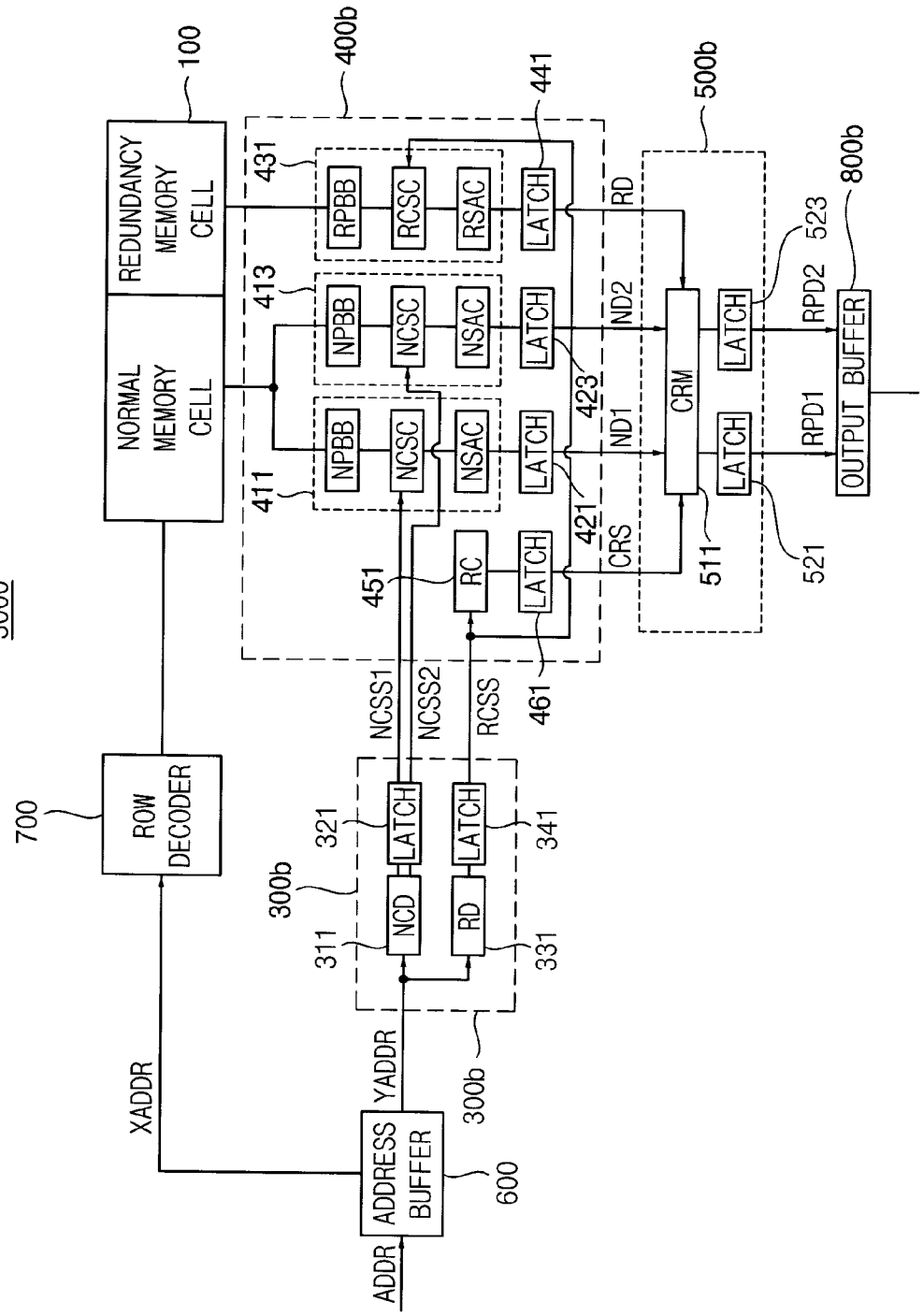
FIG. 8 is block diagram illustrating an example of a non-volatile memory device of FIG. 7.

FIG. 8 is block diagram illustrating an example of a nonvolatile memory device of FIG. 7.

The column decoder 300b, the loading circuit 400b and the repair circuit 500b included in the pipeline circuit 200b of FIG. 7 are illustrated in detail in FIG. 8.

The memory cell array 100, the address buffer 600 and the row decoder 700 are described with reference to FIG. 4. Thus, a detailed description of the memory cell array 100, the address buffer 600 and the row decoder 700 will be omitted.

Referring to FIG. 8, the column decoder 300b may include a normal column decoder NCD 311, a seventh latch circuit 321, a repair detection circuit RD 331 and an eighth latch circuit 341.

The normal column decoder 311 may receive the column address YADDR from the address buffer 600, generate the consecutive two column addresses starting from the column address YADDR and generate the two normal column selection signals NCSS1 and NCSS2 in response to the consecutive two column addresses.

The seventh latch circuit 321 may latch the two normal column selection signals NCSS1 and NCSS2 received from the normal column decoder 311.

The repair detection circuit 331 may determine whether any of the consecutive two column addresses corresponds to the normal column 101 having a defect. If the repair detection circuit 331 determines that any of the consecutive two column addresses corresponds to the normal column 101 having a defect, the repair detection circuit 331 may generate a redundancy column selection signal RCSS, which represents one of the bit lines BLR1, ..., BLRK to which a redundancy column 109 corresponding to the normal column 101 having a defect is connected.

The repair detection circuit 331 may include a plurality of fuses and store addresses of normal columns 101 having a defect as repair column addresses by selectively cutting the plurality of fuses. The repair detection circuit 331 may determine whether any of the consecutive two column addresses corresponds to the normal column 101 having a defect by comparing the consecutive two column addresses with the repair column addresses. A value of the redundancy column selection signal RCSS may be predetermined for each of the repair column addresses. Therefore, if one of the consecutive two column addresses is the same as one of the repair column addresses, the repair detection circuit 331 may generate the redundancy column selection signal RCSS, which represents predetermined one of the bit lines BLR1, . . . , BLRK. If any of the consecutive two column addresses is not the same as any of the repair column addresses, the repair detection circuit 331 may generate the redundancy column selection signal RCSS having the predetermined value indicating that all of the consecutive two column addresses do not correspond to the normal column 101 having a defect. In other example embodiments, if any of the consecutive two column addresses is not the same as any of the repair column addresses, the repair detection circuit 331 may generate a separate control signal representing that all of the consecutive two column addresses do not correspond to the normal column 101 having a defect.

The eighth latch circuit 341 may latch the redundancy column selection signal RCSS received from the repair detection circuit 331.

The loading circuit 400b may include normal column selection units 411 and 413, ninth latch circuits 421 and 423, a redundancy column selection unit 431, a tenth latch circuit 441, a repair control circuit RC 451 and an eleventh latch circuit 461.

The normal column selection units 411 and 413 may be connected to the normal memory cells of the memory cell array 100 through the bit lines BL1, . . . , BLM. The normal column selection unit 411 may select one of data provided from the normal memory cells through the bit lines BL1, . . . , BLM in response to the first normal column selection signal NCSS1 received from the seventh latch circuit 321 and provide the selected data as the first normal data ND1. The normal column selection unit 413 may select one of data provided from the normal memory cells through the bit lines BL1, . . . , BLM in response to the second normal column selection signal NCSS2 received from the seventh latch circuit 321 and provide the selected data as the second normal data ND2.

Each of the normal column selection units 411 and 413 may include a normal page buffer block NPBB, a normal column selection circuit NCSC and a normal sense amp circuit NSAC.

Each of the normal page buffer blocks NPBB included in the normal column selection units 411 and 413 may include a plurality of normal page buffers. Each of the plurality of normal page buffers may be connected to the corresponding bit lines BL1, . . . , BLM. Each of the plurality of normal page buffers may load data from the normal memory cells through the corresponding bit lines BL1, . . . , BLM. In some other example embodiments, the normal column selection units 411 and 413 may share one normal page buffer block NPBB.

The normal column selection circuit NCSC included in the normal column selection unit 411 may select a predetermined number of the normal page buffers in response to the first normal column selection signal NCSS1 received from the seventh latch circuit 321 and output the loaded data of the selected normal page buffers. The normal column selection circuit NCSC included in the normal column selection unit 413 may select a predetermined number of the normal page buffers in response to the second normal column selection signal NCSS2 received from the seventh latch circuit 321 and output the loaded data of the selected normal page buffers. The predetermined number of the normal page buffers may be determined according to the number of bits included in a data line of the non-volatile memory device 3000. For example, if the non-volatile memory device 3000 outputs sixteen bits of data, the predetermined number of the normal page buffers may be sixteen.

The normal sense amp circuit NSAC included in the normal column selection unit 411 may amplify data received from corresponding normal column selection circuit NCSC to provide the first normal data ND1. The normal sense amp circuit NSAC included in the normal column selection unit 413 may amplify data received from corresponding normal column selection circuit NCSC to provide the second normal data ND2.

The ninth latch circuit 421 may latch the first normal data ND1 received from the normal column selection unit 411. The ninth latch circuit 423 may latch the second normal data ND2 received from the normal column selection unit 413.

The redundancy column selection unit 431 may be connected to the redundancy memory cells of the memory cell array 100 through the bit lines BLR1, . . . , BLRK. The redundancy column selection unit 431 may select one of data provided from the redundancy memory cells through the bit lines BLR1, . . . , BLRK in response to the redundancy column selection signal RCSS received from the eighth latch circuit 341 and provide the selected data as the redundancy data RD.

The redundancy column selection unit 431 may include a redundancy page buffer block RPBB, a redundancy column selection circuit RCSC and a redundancy sense amp circuit RSAC.

The redundancy page buffer block RPBB may include a plurality of redundancy page buffers. Each of the plurality of redundancy page buffers may be connected to the corresponding bit lines BLR1, . . . , BLRK. Each of the plurality of redundancy page buffers may load data from the redundancy memory cells through the corresponding bit lines BLR1, . . . , BLRK.

The redundancy column selection circuit RCSC may select a predetermined number of the redundancy page buffers in response to the redundancy column selection signal RCSS received from the eighth latch circuit 341 and output the loaded data of the selected redundancy page buffers. The redundancy column selection signal RCSS may have a predetermined value according to repair column addresses, which represent addresses of the normal columns having a defect. The predetermined value of the redundancy column selection signal RCSS may be physically coded in the redundancy column selection circuit RCSC. Therefore, the selected redundancy page buffers may be predetermined according to the predetermined value of the redundancy column selection signal RCSS. If the redundancy column selection signal RCSS indicates that all of the consecutive two column addresses do not correspond to the normal column 101 having a defect, the redundancy column selection circuit RCSC may not select any redundancy page buffer since output of the redundancy column selection circuit RCSC is not used to repair the first normal data ND1 and the second normal data ND2. The predetermined number of the redundancy page buffers may be determined according to the number of bits included in the data line of the non-volatile memory device 3000. For example, if the non-volatile memory device 3000 outputs sixteen bits of data, the predetermined number of the redundancy page buffers may be sixteen.

The redundancy sense amp circuit RSAC may amplify data received from the redundancy column selection circuit RCSC to provide the redundancy data RD.

The tenth latch circuit 441 may latch the redundancy data RD received from the redundancy sense amp circuit RSAC.

The repair control circuit 451 may generate the column repair signal CRS, which represents whether any of the consecutive two column addresses corresponds to the normal column 101 having a defect, in response to the redundancy column selection signal RCSS received from the eighth latch circuit 341. For example, the repair control circuit 451 may generate the column repair signal CRS having a first value when the redundancy column selection signal RCSS indicates that all of the consecutive two column addresses do not correspond to the normal column 101 having a defect, generate the column repair signal CRS having a second value when the redundancy column selection signal RCSS indicates that the column address YADDR corresponds to the normal column 101 having a defect and generate the column repair signal CRS having a third value when the redundancy column selection signal RCSS indicates that an column address next to the column address YADDR corresponds to the normal column 101 having a defect.

The eleventh latch circuit 461 may latch the column repair signal CRS received from the repair control circuit 451.

The repair circuit 500b may include a column repair multiplexer 511 and twelfth latch circuits 521 and 523.

The column repair multiplexer 511 may receive the first normal data ND1 from the ninth latch circuit 421, receive the second normal data ND2 from the ninth latch circuit 423, receive the redundancy data RD from the tenth latch circuit 441 and receive the column repair signal CRS from the eleventh latch circuit 461. The column repair multiplexer 511 may output two of the first normal data ND1, the second normal data ND2 and the redundancy data RD as the first repair data RPD1 and the second repair data RPD2 in response to the column repair signal CRS. The column repair multiplexer 511 may output the first normal data ND1 as the first repair data RPD1 and output the second normal data ND2 as the second repair data RPD2 when the column repair signal CRS indicates that all of the consecutive two column addresses do not correspond to the normal column 101 having a defect. The column repair multiplexer 511 may output the redundancy data RD as the first repair data RPD1 and output the second normal data ND2 as the second repair data RPD2 when the column repair signal CRS indicates that the column address YADDR corresponds to the normal column 101 having a defect. The column repair multiplexer 511 may output the first normal data ND1 as the first repair data RPD1 and output the redundancy data RD as the second repair data RPD2 when the column repair signal CRS indicates that an column address next to the column address YADDR corresponds to the normal column 101 having a defect. The column repair multiplexer 511 may include a multiplexer that receives the first normal data ND1 as a first input data, receives the second normal data ND2 as a second input data, receives the redundancy data RD as a third input data and receives the column repair signal CRS as a control signal. The multiplexer may output the first normal data ND1 as the first repair data RPD1 and output the second normal data ND2 as the second repair data RPD2 when the column repair signal CRS has the first value. The multiplexer may output the redundancy data RD as the first repair data RPD1 and output the second normal data ND2 as the second repair data RPD2 when the column repair signal CRS has the second value. The multiplexer may output the first normal data ND1 as the first repair data RPD1 and output the redundancy data RD as the second repair data RPD2 when the column repair signal CRS has the third value.

The twelfth latch circuit 521 may latch the first repair data RPD1 received from the column repair multiplexer 511. The twelfth latch circuit 523 may latch the second repair data RPD2 received from the column repair multiplexer 511.

The output buffer 800b may receive the first repair data RPD1 from the twelfth latch circuit 521, receive the second repair data RPD2 from the twelfth latch circuit 523 and output the first repair data RPD1 and the second repair data RPD2 consecutively.

Figure 9:
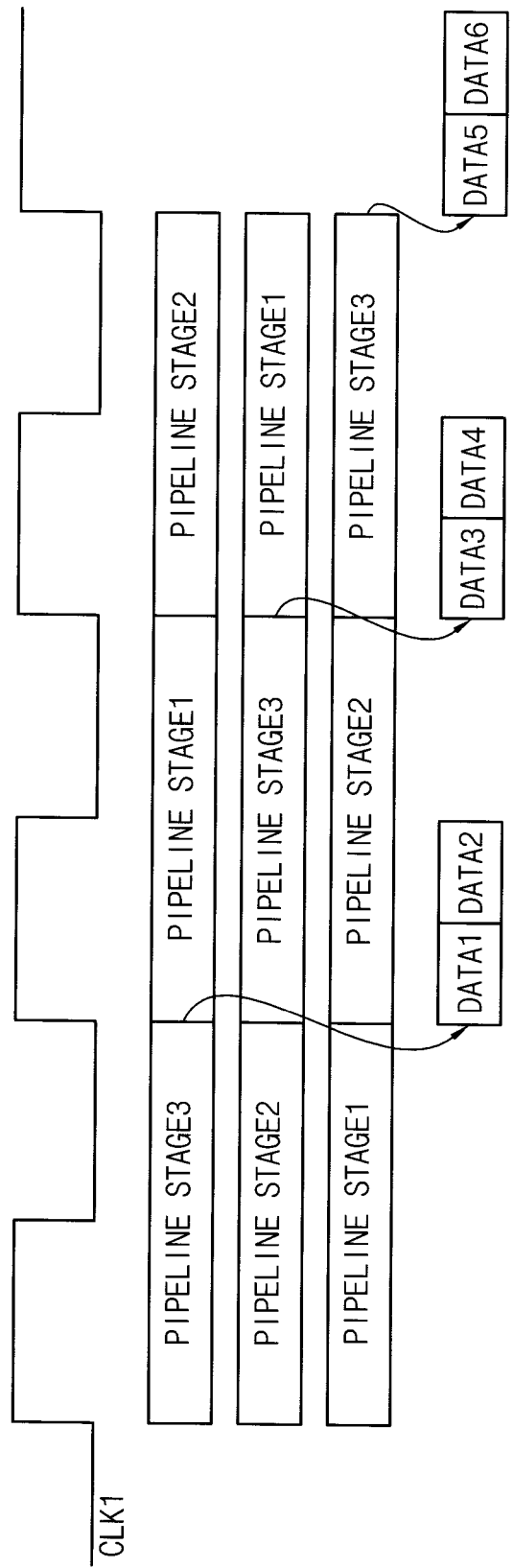
FIG. 9 is a timing diagram for describing an operation of a non-volatile memory device of FIG. 8.

FIG. 9 is a timing diagram for describing an operation of a non-volatile memory device of FIG. 8.

In FIG. 9, a clock signal CLK1 may represent a common clock signal of the seventh latch circuit 321, the eighth latch circuit 341, the ninth latch circuits 421 and 423, the tenth latch circuit 441, the eleventh latch circuit 461 and the twelfth latch circuits 521 and 523. A first pipeline stage PIPELINE STAGE 1 represents a period during which the column decoder 300b operates, a second pipeline stage PIPELINE STAGE 2 represents a period during which the loading circuit 400b operates and a third pipeline stage PIPELINE STAGE 3 represents a period during which the repair circuit 500b operates.

Referring to FIG. 9, all of the first pipeline stage, the second pipeline stage and the third pipeline stage operate simultaneously during one clock cycle. That is, the column decoder 300b generates the first normal column selection signal NCSS1, the second normal column selection signal NCSS2 and the redundancy column selection signal RCSS in response to the column address YADDR during the one clock cycle. The loading circuit 400b generates the first normal data ND1 in response to the first normal column selection signal NCSS1, generates the second normal data ND2 in response to the second normal column selection signal NCSS2, generates the redundancy data RD in response to the redundancy column selection signal RCSS, generates the column repair signal CRS in response to the redundancy column selection signal RCSS and latches the first normal data ND1, the second normal data ND2, the redundancy data RD and the column repair signal CRS during the one clock cycle. The repair circuit 500b generates the first repair data RPD1 and the second repair data RPD2 in response to the first normal data ND1, the second normal data ND2, the redundancy data RD and the column repair signal CRS during the one clock cycle.

Therefore, the non-volatile memory device 3000 may output the first repair data RPD1 and the second repair data RPD2 during one clock cycle. As illustrated in FIG. 9, the non-volatile memory device 3000 outputs a first data DATA1 and a second data DATA2 at the end of the first clock cycle, outputs a third data DATA3 and a fourth data DATA4 at the end of the second clock cycle and outputs a fifth data DATA5 and a sixth data DATA6 at the end of the third clock cycle.

As described above with reference to FIGS. 7, 8 and 9, the operation speed of the non-volatile memory device 3000 may be increased since the non-volatile memory device 3000 includes the pipeline circuit 200b that operates both in a pipeline manner and in a prefetch mode to output the first repair data RPD1 and the second repair data RPD2 during at least two consecutive clock cycles.

Figure 10:
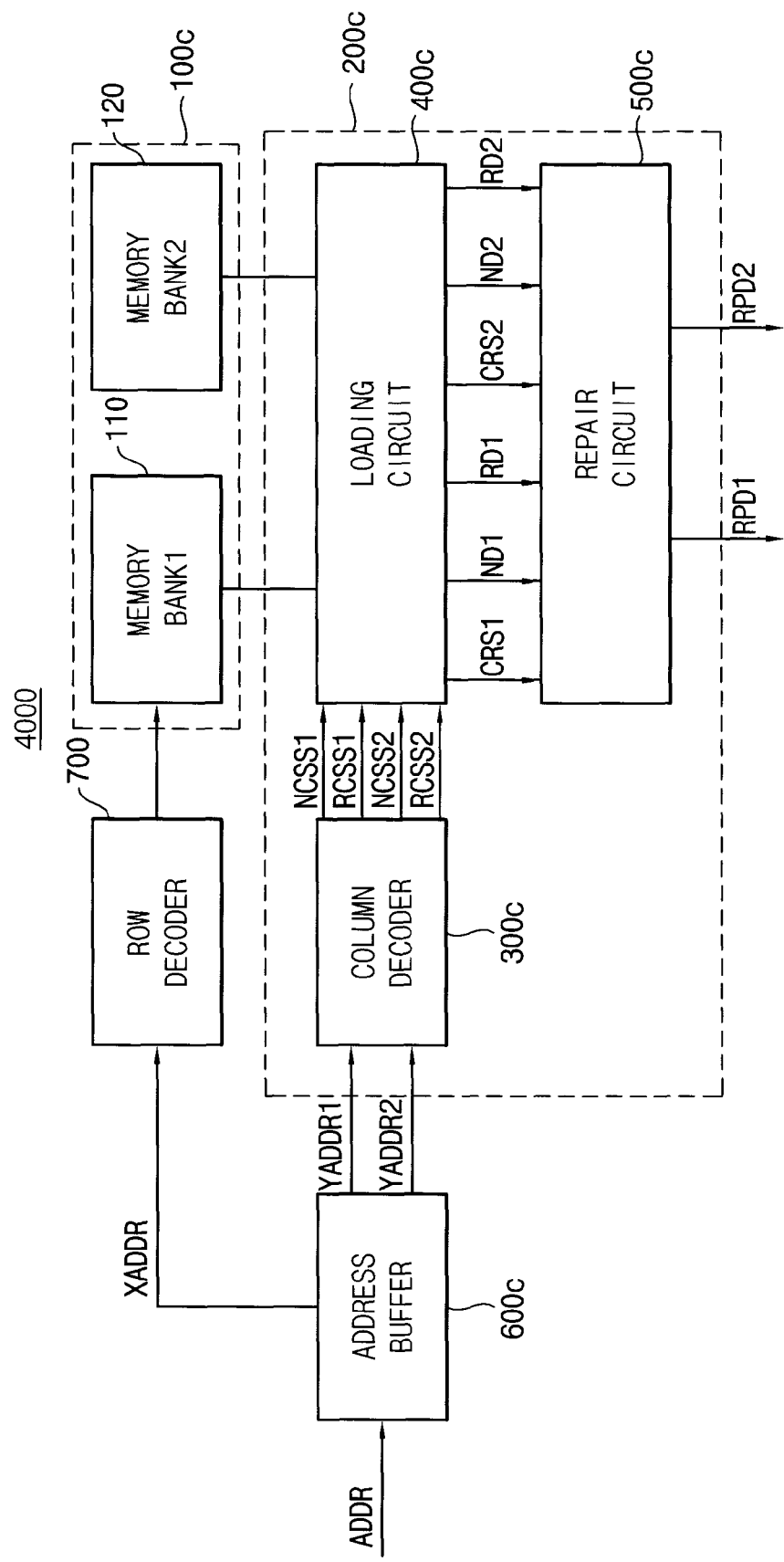
FIG. 10 is a block diagram illustrating a non-volatile memory device according to example embodiments.

FIG. 10 is a block diagram illustrating a non-volatile memory device according to example embodiments.

Referring to FIG. 10, a non-volatile memory device 4000 includes a memory cell array 100c and a pipeline circuit 200c. The non-volatile memory device 4000 may further include an address buffer 600c and a row decoder 700.

The non-volatile memory device 4000 may operate both in a pipeline manner and in an interleaving mode. Generally, in an interleaving mode, a memory cell array includes a plurality of memory banks and consecutive addresses are allocated to separate memory banks so that operations of accessing the plurality of memory banks are interleaved to increase an operation speed of a memory device.

In FIG. 10, the non-volatile memory device 4000 includes two memory banks that operate in an interleaving mode. However, in some other example embodiments, the non-volatile memory device 4000 may include more than three memory banks that operate in an interleaving mode.

The memory cell array 100c may include a first memory bank 110 and a second memory bank 120. Each of the first memory bank 110 and the second memory bank 120 may include a plurality of normal columns 101 having normal memory cells and a plurality of redundancy columns 109 having redundancy memory cells.

The pipeline circuit 200c may operate in an interleaving mode such that a first reading operation, in which the pipeline circuit 200c loads data from the first memory bank 110, repairs the loaded data and latches the repaired data, and a second reading operation, in which the pipeline circuit 200c loads data from the second memory bank 120, repairs the loaded data and latches the repaired data, are performed in turn at a predetermined time interval.

The address buffer 600c may receive address ADDR corresponding to memory cells to be accessed and generate a first address for accessing the first memory bank 110 and a second address for accessing the second memory bank 120. The first address and the second address may be consecutive addresses starting from the address ADDR. The address buffer 600c may generate a row address XADDR for selecting a word line, to which a memory cell to be accessed included in the first memory bank 110 and a memory cell to be accessed included in the second memory bank 120 are commonly connected, in response to the first address and the second address and provide the row address XADDR to the row decoder 700. The address buffer 600c may generate a first column address YADDR1 for selecting a bit line, to which a memory cell to be accessed included in the first memory bank 110 is connected, in response to the first address, generate a second column address YADDR2 for selecting a bit line, to which a memory cell to be accessed included in the second memory bank 120 is connected, in response to the second address and provide the first column address YADDR1 and the second column address YADDR2 to the pipeline circuit 200c.

The row decoder 700 included in the non-volatile memory device 4000 of FIG. 10 may have the same structure as the row decoder 700 included in the non-volatile memory device 2000 of FIG. 4. Thus, a detailed description of the row decoder 700 included in the non-volatile memory device 4000 will be omitted.

The pipeline circuit 200c may include a column decoder 300c, a loading circuit 400c and a repair circuit 500c.

The column decoder 300c may receive the first column address YADDR1 and the second column address YADDR2 from the address buffer 600c. The column decoder 300c may generate a first normal column selection signal NCSS1 in response to the first column address YADDR1. The first normal column selection signal NCSS1 may represent one of the bit lines BL1, . . . , BLM to which a normal column 101 including a normal memory cell to be accessed is connected in the first memory bank 110. The column decoder 300c may generate a second normal column selection signal NCSS2 in response to the second column address YADDR2. The second normal column selection signal NCSS2 may represent one of the bit lines BL1, . . . , BLM to which a normal column 101 of the second memory bank 120 including a normal memory cell to be accessed is connected in the second memory bank 120. The column decoder 300c may latch the first normal column selection signal NCSS1 and the second normal column selection signal NCSS2.

The column decoder 300a may determine whether the first column address YADDR1 and the second column address YADDR2 correspond to a normal column 101 having a defect. If the column decoder 300c determines that the first column address YADDR1 corresponds to the normal column 101 having a defect, the column decoder 300c may generate a first redundancy column selection signal RCSS1, which represents one of the bit lines BLR1, . . . , BLRK to which a redundancy column 109 corresponding to the normal column 101 having a defect is connected in the first memory bank 110. If the column decoder 300c determines that the first column address YADDR1 does not correspond to the normal column 101 having a defect, the column decoder 300c may generate the first redundancy column selection signal RCSS1 having a predetermined value indicating that the first column address YADDR1 does not correspond to the normal column 101 having a defect. For example, if the column decoder 300c determines that the first column address YADDR1 does not correspond to the normal column 101 having a defect, the column decoder 300c may generate the first redundancy column selection signal RCSS1 having a value of zero. In other example embodiments, if the column decoder 300c determines that the first column address YADDR1 does not correspond to the normal column 101 having a defect, the column decoder 300c may generate a separate control signal representing that the first column address YADDR1 does not correspond to the normal column 101 having a defect.

If the column decoder 300c determines that the second column address YADDR2 corresponds to the normal column 101 having a defect, the column decoder 300c may generate a second redundancy column selection signal RCSS2, which represents one of the bit lines BLR1, . . . , BLRK to which a redundancy column 109 corresponding to the normal column 101 having a defect is connected in the second memory bank 120. If the column decoder 300c determines that the second column address YADDR2 does not correspond to the normal column 101 having a defect, the column decoder 300c may generate the second redundancy column selection signal RCSS2 having a predetermined value indicating that the second column address YADDR2 does not correspond to the normal column 101 having a defect. For example, if the column decoder 300c determines that the second column address YADDR2 does not correspond to the normal column 101 having a defect, the column decoder 300c may generate the second redundancy column selection signal RCSS2 having a value of zero. In other example embodiments, if the column decoder 300c determines that the second column address YADDR2 does not correspond to the normal column 101 having a defect, the column decoder 300c may generate a separate control signal representing that the second column address YADDR2 does not correspond to the normal column 101 having a defect. The column decoder 300c may latch the first redundancy column selection signal RCSS1 and the second redundancy column selection signal RCSS2.

The loading circuit 400c may select one of the bit lines BL1, . . . , BLM to which the normal column 101 including the normal memory cell to be accessed is connected in the first memory bank 110 in response to the first normal column selection signal NCSS1, load data received from the first memory bank 110 through the selected bit line and latch the loaded data as a first normal data ND1. The loading circuit 400c may select one of the bit lines BL1, . . . , BLM to which the normal column 101 including the normal memory cell to be accessed is connected in the second memory bank 120 in response to the second normal column selection signal NCSS2, load data received from the second memory bank 120 through the selected bit line and latch the loaded data as a second normal data ND2. If the first redundancy column selection signal RCSS1 does not have the predetermined value, the loading circuit 400c may select one of the bit lines BLR1, . . . , BLRK to which the redundancy column 109 corresponding to the normal column 101 having a defect is connected in the first memory bank 110 in response to the first redundancy column selection signal RCSS1, load data received from the first memory bank 110 through the selected bit line and latch the loaded data as a first redundancy data RD1. If the first redundancy column selection signal RCSS1 has the predetermined value, the loading circuit 400c may not load and latch any data from the redundancy memory cells of the first memory bank 110 since, as will be described later, the repair circuit 500c does not use the first redundancy data RD1 to repair the first normal data ND1. If the second redundancy column selection signal RCSS2 does not have the predetermined value, the loading circuit 400c may select one of the bit lines BLR1, . . . , BLRK to which the redundancy column 109 corresponding to the normal column 101 having a defect is connected in the second memory bank 120 in response to the second redundancy column selection signal RCSS2, load data received from the second memory bank 120 through the selected bit line and latch the loaded data as a second redundancy data RD2. If the second redundancy column selection signal RCSS2 has the predetermined value, the loading circuit 400c may not load and latch any data from the redundancy memory cells of the second memory bank 120 since, as will be described later, the repair circuit 500c does not use the second redundancy data RD2 to repair the second normal data ND2.

The loading circuit 400c may generate a first column repair signal CRS1 in response to the first redundancy column selection signal RCSS1. For example, the loading circuit 400c may generate the first column repair signal CRS1 having a first value when the first redundancy column selection signal RCSS1 indicates that the first column address YADDR1 does not correspond to the normal column 101 having a defect and generate the first column repair signal CRS1 having a second value when the first redundancy column selection signal RCSS1 indicates that the first column address YADDR1 corresponds to the normal column 101 having a defect. The loading circuit 400c may generate a second column repair signal CRS2 in response to the second redundancy column selection signal RCSS2. For example, the loading circuit 400c may generate the second column repair signal CRS2 having a first value when the second redundancy column selection signal RCSS2 indicates that the second column address YADDR2 does not correspond to the normal column 101 having a defect and generate the second column repair signal CRS2 having a second value when the second redundancy column selection signal RCSS2 indicates that the second column address YADDR2 corresponds to the normal column 101 having a defect.

The repair circuit 500c may receive the first column repair signal CRS1, the first normal data ND1, the first redundancy data RD1, the second column repair signal CRS2, the second normal data ND2, the second redundancy data RD2. The repair circuit 500c may generate the first repair data RPD1 by repairing the first normal data ND1 using the first redundancy data RD1 in response to the first column repair signal CRS1. The repair circuit 500c may generate the second repair data RPD2 by repairing the second normal data ND2 using the second redundancy data RD2 in response to the second column repair signal CRS2. The repair circuit 500c may latch the first repair data RPD1 and the second repair data RPD2.

Figure 11:
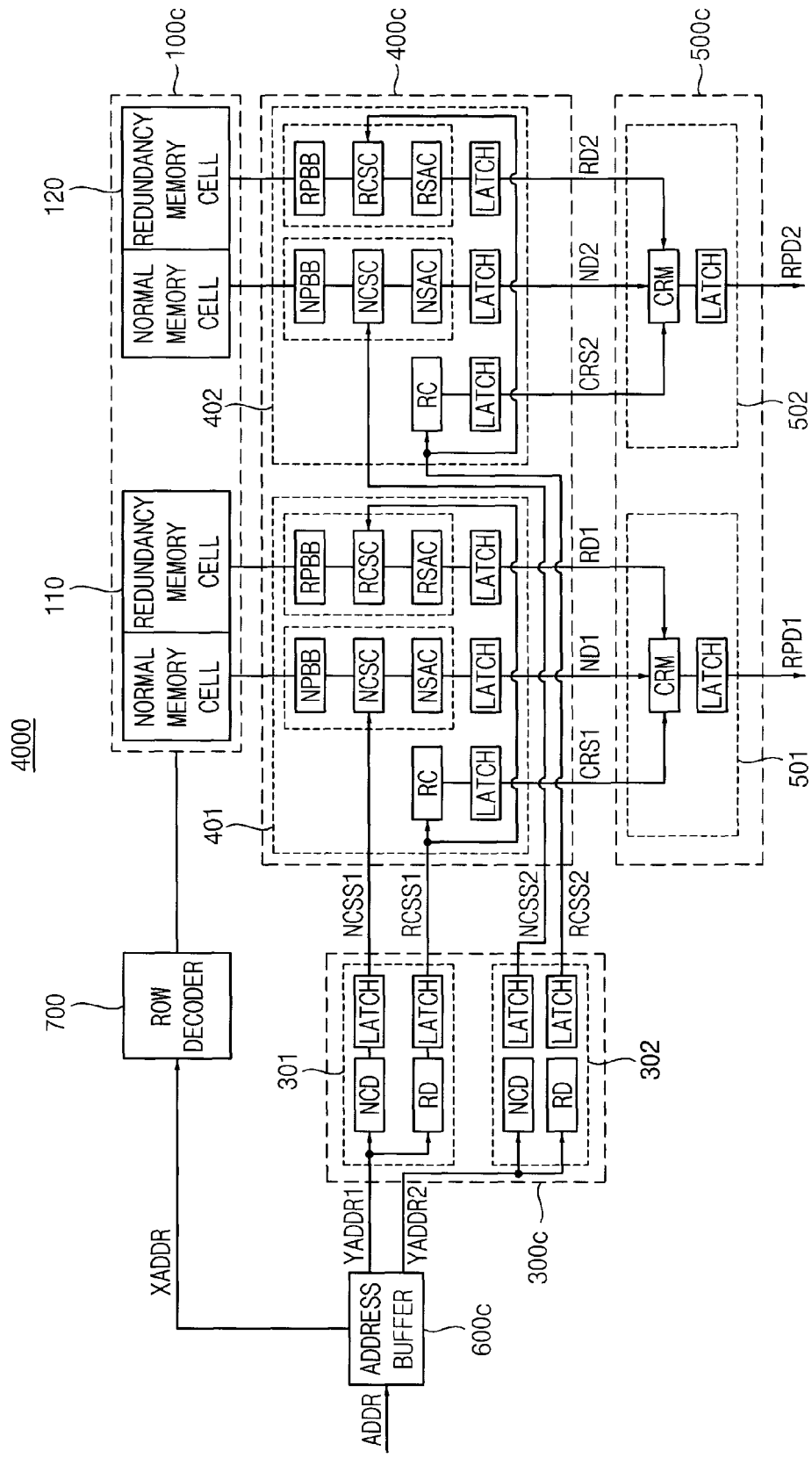
FIG. 11 is block diagram illustrating an example of a non-volatile memory device of FIG. 10.

FIG. 11 is block diagram illustrating an example of a non-volatile memory device of FIG. 10.

The column decoder 300c, the loading circuit 400c and the repair circuit 500c included in the pipeline circuit 200c of FIG. 10 are illustrated in detail in FIG. 11.

The memory cell array 100c and the address buffer 600c are described with reference to FIG. 10. The row decoder 700 is described with reference to FIG. 4. Thus, a detailed description of the memory cell array 100c, the address buffer 600c and the row decoder 700 will be omitted.

Referring to FIG. 11, the column decoder 300c may include a first column decoder 301 and a second column decoder 302, the loading circuit 400c may include a first loading circuit 401 and a second loading circuit 402, and the repair circuit 500c may include a first repair circuit 501 and a second repair circuit 502.

The first column decoder 301 may generate the first normal column selection signal NCSS1 and the first redundancy column selection signal RCSS1 in response to the first column address YADDR1 and latch the first normal column selection signal NCSS1 and the first redundancy column selection signal RCSS1. The first loading circuit 401 may generate the first normal data ND1 in response to the first normal column selection signal NCSS1, generate the first redundancy data RD1 in response to the first redundancy column selection signal RCSS1, generate the first column repair signal CRS1 in response to the first redundancy column selection signal RCSS1, and latch the first normal data ND1, the first redundancy data RD1 and the first column repair signal CRS1. The first repair circuit 501 may generate the first repair data RPD1 in response to the first normal data ND1, the first redundancy data RD1 and the first column repair signal CRS1, and latch the first repair data RPD1.

The second column decoder 302 may generate the second normal column selection signal NCSS2 and the second redundancy column selection signal RCSS2 in response to the second column address YADDR1 and latch the second normal column selection signal NCSS2 and the second redundancy column selection signal RCSS2. The second loading circuit 402 may generate the second normal data ND2 in response to the second normal column selection signal NCSS2, generate the second redundancy data RD2 in response to the second redundancy column selection signal RCSS2, generate the second column repair signal CRS2 in response to the second redundancy column selection signal RCSS2, and latch the second normal data ND2, the second redundancy data RD2 and the second column repair signal CRS2. The second repair circuit 502 may generate the second repair data RPD2 in response to the second normal data ND2, the second redundancy data RD2 and the second column repair signal CRS2, and latch the second repair data RPD2.

Each of the first column decoder 301 and the second column decoder 302 may have the same structure as the column decoder 300a included in the non-volatile memory device 2000 of FIG. 5. Each of the first loading circuit 401 and the second loading circuit 402 may have the same structure as the loading circuit 400a included in the non-volatile memory device 2000 of FIG. 5. Each of the first repair circuit 501 and the second repair circuit 502 may have the same structure as the repair circuit 500a included in the non-volatile memory device 2000 of FIG. 5. Thus, a detailed description of the first column decoder 301, the second column decoder 302, the first loading circuit 401, the second loading circuit 402, the first repair circuit 501 and the second repair circuit 502 included in the non-volatile memory device 4000 will be omitted.

A first pipeline stream may include the first column decoder 301, the first loading circuit 401 and the first repair circuit 501. A second pipeline stream may include the second column decoder 302, the second loading circuit 402 and the second repair circuit 502. Therefore, the first pipeline stream and the second pipeline stream may have the same structure. The first pipeline stream may perform the first reading operation, in which the first pipeline stream loads data from the first memory bank 110 in response to the first column address YADDR1, repairs the loaded data and latches the repaired data, in a pipeline manner. The second pipeline stream may perform the second reading operation, in which the second pipeline stream loads data from the second memory bank 120 in response to the second column address YADDR2, repairs the loaded data and latches the repaired data, in a pipeline manner. In addition, the first pipeline stream and the second pipeline stream operate in an interleaving mode such that the first pipeline stream and the second pipeline stream operate in turn at a predetermined time interval. Therefore, the pipeline circuit 200c may operate both in a pipeline manner and in an interleaving mode.

Figure 12:
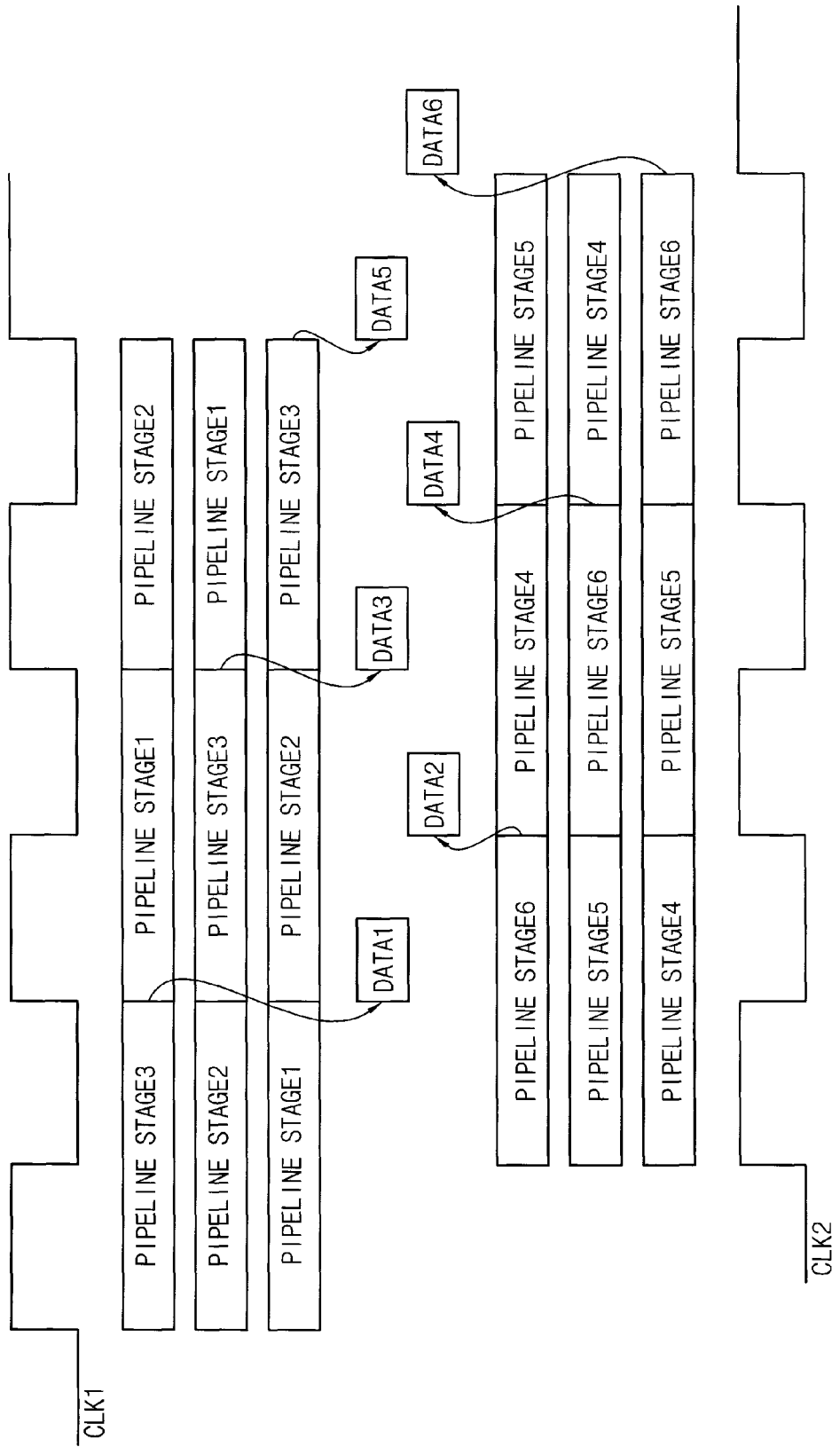
FIG. 12 is a timing diagram for describing an operation of a non-volatile memory device of FIG. 11.

FIG. 12 is a timing diagram for describing an operation of a non-volatile memory device of FIG. 11.

In FIG. 12, a first clock signal CLK1 may represent a common clock signal of latch circuits included in the first column decoder 301, the first loading circuit 401 and the first repair circuit 501. A second clock signal CLK2 may represent a common clock signal of latch circuits included in the second column decoder 302, the second loading circuit 402 and the second repair circuit 502. A first pipeline stage PIPELINE STAGE 1 represents a period during which the first column decoder 301 operates, a second pipeline stage PIPELINE STAGE 2 represents a period during which the first loading circuit 401 operates, a third pipeline stage PIPELINE STAGE 3 represents a period during which the first repair circuit 501 operates, a fourth pipeline stage PIPELINE STAGE 4 represents a period during which the second column decoder 302 operates, a fifth pipeline stage PIPELINE STAGE 5 represents a period during which the second loading circuit 402 operates, a sixth pipeline stage PIPELINE STAGE 6 represents a period during which the second repair circuit 502 operates.

Referring to FIG. 12, the first pipeline stream operates in a pipeline manner such that all of the first pipeline stage, the second pipeline stage and the third pipeline stage operate simultaneously during one clock cycle of the first clock signal CLK1. The second pipeline stream operates in a pipeline manner such that all of the fourth pipeline stage, the fifth pipeline stage and the sixth pipeline stage operate simultaneously during one clock cycle of the second clock signal CLK2. A frequency of the first clock signal CLK1 equals a frequency of the second clock signal CLK2 and a phase of the first clock signal CLK1 differs from a phase of the second clock signal CLK2 by 180 degree. Therefore, the first pipeline stream and the second pipeline stream may operate in an interleaving mode such that the first reading operation and the second reading operation are performed in turn at a time interval of half of a period of the first clock signal CLK1 and the second clock signal CLK2.

The first repair circuit 501 may output the first repair data RPD1 during one clock cycle of the first clock signal CLK1 and the second repair circuit 502 may output the second repair data RPD2 during one clock cycle of the second clock signal CLK2. Therefore, the non-volatile memory device 4000 may output both the first repair data RPD1 and the second repair data RPD2 during one period of the first clock signal CLK1 and the second clock signal CLK2. As illustrated in FIG. 12, the first repair circuit 501 of the non-volatile memory device 4000 outputs a first data DATA1 at the end of the first clock cycle of the first clock signal CLK1, outputs a third data DATA3 at the end of the second clock cycle of the first clock signal CLK1 and outputs a fifth data DATA5 at the end of the third clock cycle of the first clock signal CLK1. The second repair circuit 502 of the non-volatile memory device 4000 outputs a second data DATA2 at the end of the first clock cycle of the second clock signal CLK2, outputs a fourth data DATA4 at the end of the second clock cycle of the second clock signal CLK2 and outputs a sixth data DATA6 at the end of the third clock cycle of the second clock signal CLK2.

As described above with reference to FIGS. 10, 11 and 12, the operation speed of the non-volatile memory device 4000 may be increased since the non-volatile memory device 4000 includes the pipeline circuit 200c that operates both in a pipeline manner and in an interleaving mode to output two repair data RPD1 and RPD2 during one period of the first clock signal CLK1 and the second clock signal CLK2.

Figure 13:
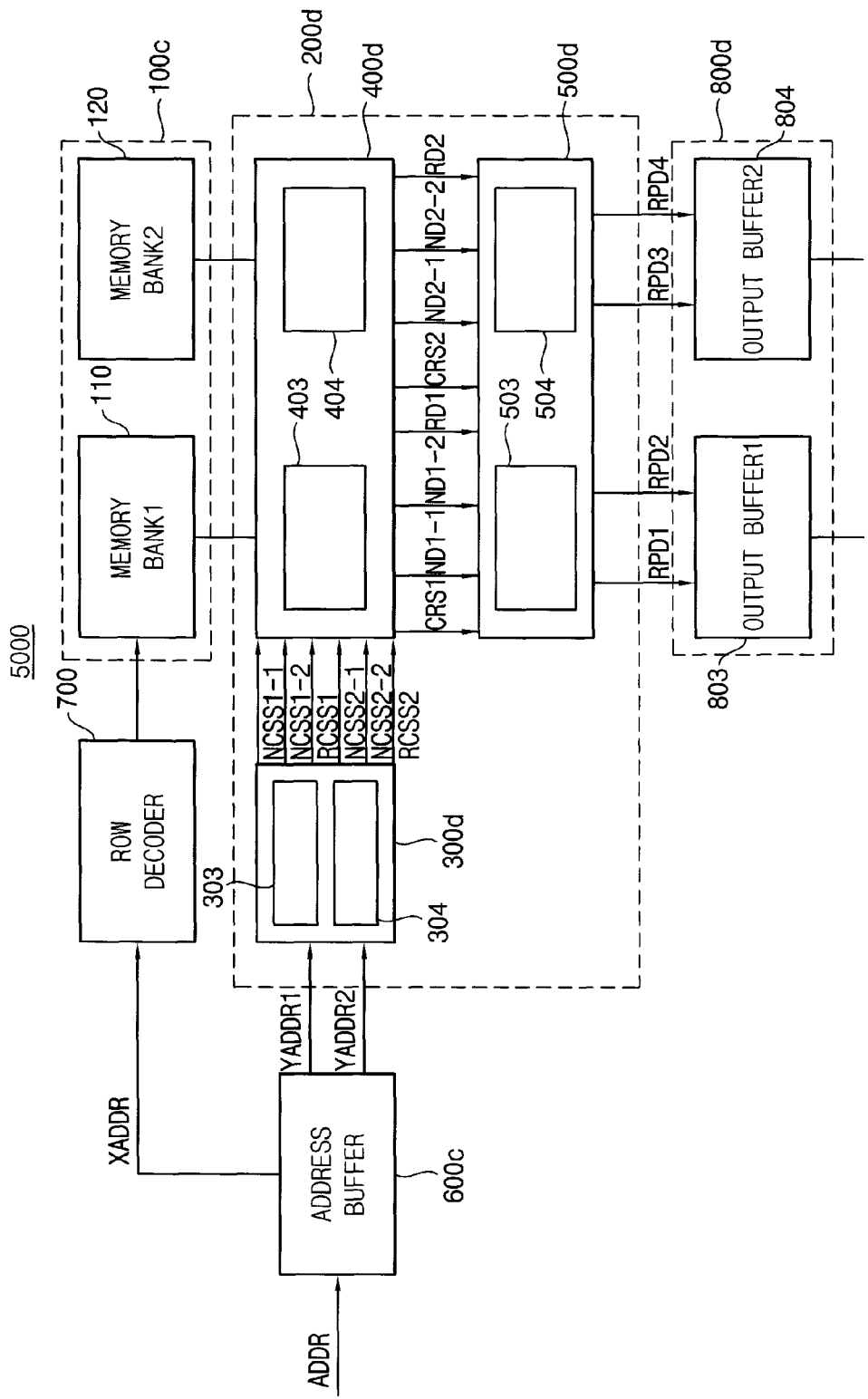
FIG. 13 is a block diagram illustrating a non-volatile memory device according to example embodiments.

FIG. 13 is a block diagram illustrating a non-volatile memory device according to example embodiments.

Referring to FIG. 13, a non-volatile memory device 5000 includes a memory cell array 100c, a pipeline circuit 200d and an output buffer 800d. The non-volatile memory device 5000 may further include an address buffer 600c and a row decoder 700.

The memory cell array 100c and the address buffer 600c included in the non-volatile memory device 5000 of FIG. 13 may have the same structure as the memory cell array 100c and the address buffer 600c included in the non-volatile memory device 4000 of FIG. 10. The row decoder 700 included in the non-volatile memory device 5000 of FIG. 13 may have the same structure as the row decoder 700 included in the non-volatile memory device 2000 of FIG. 4. Thus, a detailed description of the memory cell array 100c, the address buffer 600c and the row decoder 700 included in the non-volatile memory device 5000 will be omitted.

The pipeline circuit 200d may include a column decoder 300d, a loading circuit 400d and a repair circuit 500d.

The column decoder 300d may include a third column decoder 303 and a fourth column decoder 304, the loading circuit 400d may include a third loading circuit 403 and a fourth loading circuit 404, and the repair circuit 500d may include a third repair circuit 503 and a fourth repair circuit 504.

Each of the third column decoder 303 and the fourth column decoder 304 may have the same structure as the column decoder 300b included in the non-volatile memory device 3000 of FIG. 8. Each of the third loading circuit 403 and the fourth loading circuit 404 may have the same structure as the loading circuit 400b included in the non-volatile memory device 3000 of FIG. 8. Each of the third repair circuit 503 and the fourth repair circuit 504 may have the same structure as the repair circuit 500b included in the non-volatile memory device 3000 of FIG. 8.

The third column decoder 303 may receive the first column address YADDR1. The third column decoder 303 may generate a first normal column selection signal NCSS1-1 and a second normal column selection signal NCSS1-2, which represent two of the bit lines BL1, . . . , BLM to which normal columns 101 including normal memory cells to be accessed are connected in the first memory bank 110, in response to consecutive two column addresses starting from the first column address YADDR1 and latch the two normal column selection signals NCSS1-1 and NCSS1-2. The third column decoder 303 may determine whether any of the consecutive two column addresses starting from the first column address YADDR1 corresponds to a normal column 101 having a defect. If the third column decoder 303 determines that any of the consecutive two column addresses starting from the first column address YADDR1 corresponds to the normal column 101 having a defect, the third column decoder 303 may generate a first redundancy column selection signal RCSS1, which represents one of the bit lines BLR1, . . . , BLRK to which a redundancy column 109 corresponding to the normal column 101 having a defect is connected in the first memory bank 110, and latch the first redundancy column selection signal RCSS1.

The fourth column decoder 304 may receive the second column address YADDR2. The fourth column decoder 304 may generate a third normal column selection signal NCSS2-1 and a fourth normal column selection signal NCSS2-2, which represent two of the bit lines BL1, ..., BLM to which normal columns 101 including normal memory cells to be accessed are connected in the second memory bank 120, in response to consecutive two column addresses starting from the second column address YADDR2 and latch the two normal column selection signals NCSS2-1 and NCSS2-2. The fourth column decoder 304 may determine whether any of the consecutive two column addresses starting from the second column address YADDR2 corresponds to a normal column 101 having a defect. If the fourth column decoder 304 determines that any of the consecutive two column addresses starting from the second column address YADDR2 corresponds to the normal column 101 having a defect, the fourth column decoder 304 may generate a second redundancy column selection signal RCSS2, which represents one of the bit lines BLR1, ..., BLRK to which a redundancy column 109 corresponding to the normal column 101 having a defect is connected in the second memory bank 120, and latch the second redundancy column selection signal RCSS2.

The third loading circuit 403 may select two of the bit lines BL1, ..., BLM to which the normal columns 101 including the normal memory cells to be accessed are connected in the first memory bank 110 in response to the two normal column selection signals NCSS1-1 and NCSS1-2, load two data received from the first memory bank 110 through the selected two bit lines and latch the loaded two data as a first normal data ND1-1 and a second normal data ND1-2. If the first redundancy column selection signal RCSS1 does not have the predetermined value, the third loading circuit 403 may select one of the bit lines BLR1, ..., BLRK to which the redundancy column 109 corresponding to the normal column 101 having a defect is connected in the first memory bank 110 in response to the first redundancy column selection signal RCSS1, load data received from the first memory bank 110 through the selected bit line and latch the loaded data as a first redundancy data RD1. The third loading circuit 403 may generate a first column repair signal CRS1 in response to the first redundancy column selection signal RCSS1.

The fourth loading circuit 404 may select two of the bit lines BL1, ..., BLM to which the normal columns 101 including the normal memory cells to be accessed are connected in the second memory bank 120 in response to the two normal column selection signals NCSS2-1 and NCSS2-2, load two data received from the second memory bank 120 through the selected two bit lines and latch the loaded two data as a third normal data ND2-1 and a fourth normal data ND2-2. If the second redundancy column selection signal RCSS2 does not have the predetermined value, the fourth loading circuit 404 may select one of the bit lines BLR1, ..., BLRK to which the redundancy column 109 corresponding to the normal column 101 having a defect is connected in the second memory bank 120 in response to the second redundancy column selection signal RCSS2, load data received from the second memory bank 120 through the selected bit line and latch the loaded data as a second redundancy data RD2. The fourth loading circuit 404 may generate a second column repair signal CRS2 in response to the second redundancy column selection signal RCSS2.

The third repair circuit 503 may receive the first column repair signal CRS1, the first normal data ND1-1, the second normal data ND1-2 and the first redundancy data RD1, generate a first repair data RPD1 and a second repair data RPD2 by repairing the first normal data ND1-1 and the second normal data ND1-2 using the first redundancy data RD1 in response to the first column repair signal CRS1 and latch the first repair data RPD1 and the second repair data RPD2.

The fourth repair circuit 504 may receive the second column repair signal CRS2, the third normal data ND2-1, the fourth normal data ND2-2 and the second redundancy data RD2, generate a third repair data RPD3 and a fourth repair data RPD4 by repairing the third normal data ND2-1 and the fourth normal data ND2-2 using the second redundancy data RD2 in response to the second column repair signal CRS2 and latch the third repair data RPD3 and the fourth repair data RPD4.

The third output buffer 803 may receive the first repair data RPD1 and the second repair data RPD2 from the third repair circuit 503 and output the first repair data RPD1 and the second repair data RPD2 consecutively. The fourth output buffer 804 may receive the third repair data RPD3 and the fourth repair data RPD4 from the fourth repair circuit 504 and output the third repair data RPD3 and the fourth repair data RPD4 consecutively.

A third pipeline stream may include the third column decoder 303, the third loading circuit 403 and the third repair circuit 503. A fourth pipeline stream may include the fourth column decoder 304, the fourth loading circuit 404 and the fourth repair circuit 504. Therefore, the third pipeline stream and the fourth pipeline stream may have the same structure. The third pipeline stream may perform the first reading operation, in which the third pipeline stream loads two data from the first memory bank 110 in response to the first column address YADDR1, repairs the loaded two data and latches the repaired two data, both in a pipeline manner and in a prefetch mode. The fourth pipeline stream may perform the second reading operation, in which the fourth pipeline stream loads two data from the second memory bank 120 in response to the second column address YADDR2, repairs the loaded two data and latches the repaired two data, both in a pipeline manner and in a prefetch mode. In addition, the third pipeline stream and the fourth pipeline stream operate in an interleaving mode such that the third pipeline stream and the fourth pipeline stream operate in turn at a predetermined time interval. Therefore, the pipeline circuit 200d may operate in a pipeline manner and both in a prefetch mode and an interleaving mode.

Figure 14:
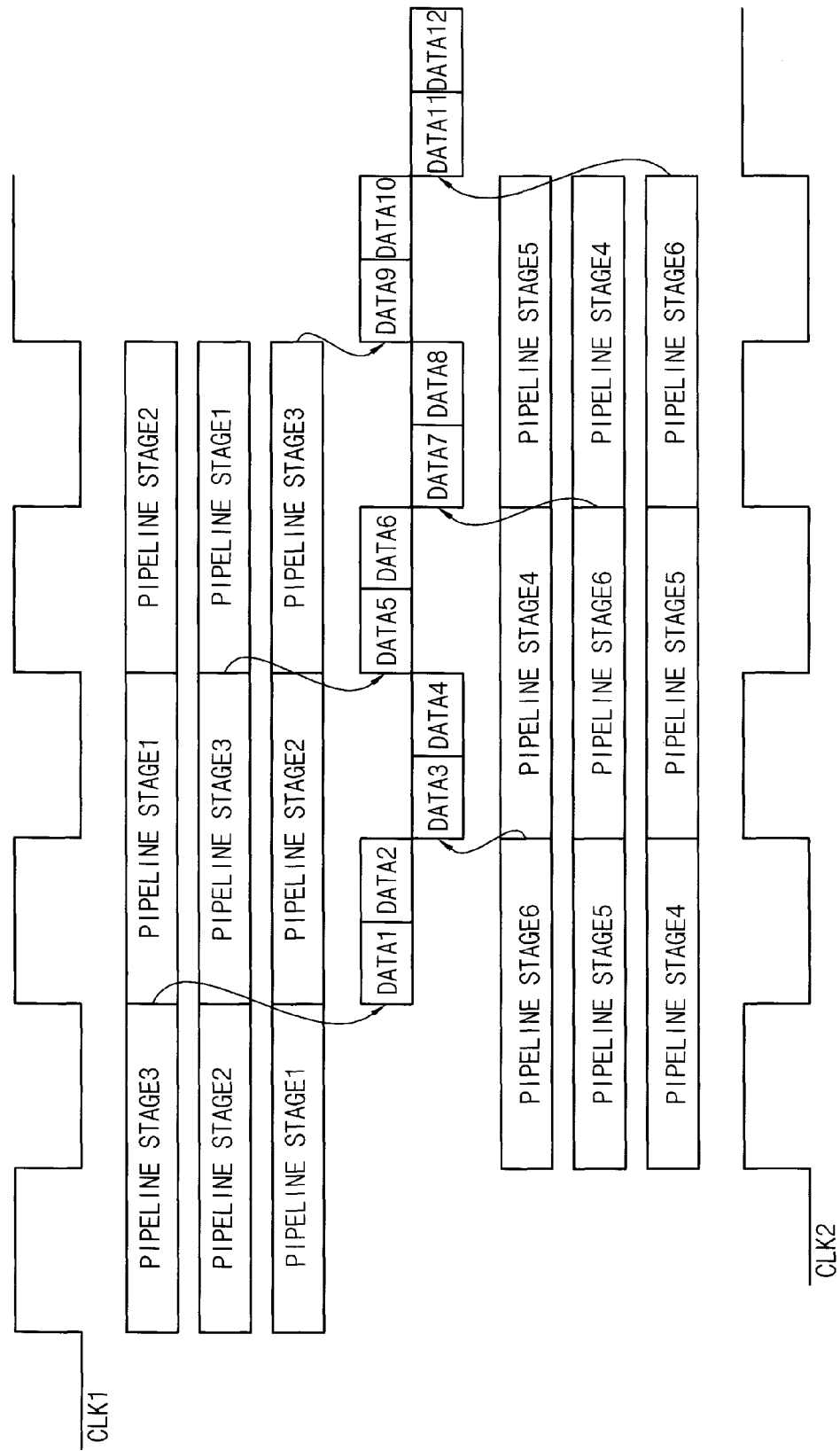
FIG. 14 is a timing diagram for describing an operation of a non-volatile memory device of FIG. 13.

FIG. 14 is a timing diagram for describing an operation of a non-volatile memory device of FIG. 13.

In FIG. 14, a first clock signal CLK1 may represent a common clock signal of latch circuits included in the third column decoder 303, the third loading circuit 403 and the third repair circuit 503. A second clock signal CLK2 may represent a common clock signal of latch circuits included in the fourth column decoder 304, the fourth loading circuit 404 and the fourth repair circuit 504. A first pipeline stage PIPELINE STAGE 1 represents a period during which the third column decoder 303 operates, a second pipeline stage PIPELINE STAGE 2 represents a period during which the third loading circuit 403 operates, a third pipeline stage PIPELINE STAGE 3 represents a period during which the third repair circuit 503 operates, a fourth pipeline stage PIPELINE STAGE 4 represents a period during which the fourth column decoder 304 operates, a fifth pipeline stage PIPELINE STAGE 5 represents a period during which the fourth loading circuit 404 operates, a sixth pipeline stage PIPELINE STAGE 6 represents a period during which the fourth repair circuit 504 operates.

Referring to FIG. 14, the third pipeline stream operates in a pipeline manner such that all of the first pipeline stage, the second pipeline stage and the third pipeline stage operate simultaneously during one clock cycle of the first clock signal CLK1. The fourth pipeline stream operates in a pipeline manner such that all of the fourth pipeline stage, the fifth pipeline stage and the sixth pipeline stage operate simultaneously during one clock cycle of the second clock signal CLK2. A frequency of the first clock signal CLK1 equals a frequency of the second clock signal CLK2 and a phase of the first clock signal CLK1 differs from a phase of the second clock signal CLK2 by 180 degree. Therefore, the third pipeline stream and the fourth pipeline stream may operate in an interleaving mode such that the first reading operation and the second reading operation are performed in turn at a time interval of half of a period of the first clock signal CLK1 and the second clock signal CLK2.

The third repair circuit 503 may output the first repair data RPD1 and the second repair data RPD2 during one clock cycle of the first clock signal CLK1 and the fourth repair circuit 504 may output the third repair data RPD3 and the fourth repair data RPD4 during one clock cycle of the second clock signal CLK2. Therefore, the non-volatile memory device 5000 may output four repair data RPD1, RPD2, RPD3 and RPD4 during one period of the first clock signal CLK1 and the second clock signal CLK2. As illustrated in FIG. 14, the third repair circuit 503 of the non-volatile memory device 5000 outputs a first data DATA1 and a second data DATA2 at the end of the first clock cycle of the first clock signal CLK1, outputs a fifth data DATA5 and a sixth data DATA6 at the end of the second clock cycle of the first clock signal CLK1 and outputs a ninth data DATA9 and a tenth data DATA10 at the end of the third clock cycle of the first clock signal CLK1. The fourth repair circuit 504 of the non-volatile memory device 5000 outputs a third data DATA3 and a fourth data DATA4 at the end of the first clock cycle of the second clock signal CLK2, outputs a seventh data DATA7 and a eighth data DATA8 at the end of the second clock cycle of the second clock signal CLK2 and outputs a eleventh data DATA11 and a twelfth data DATA12 at the end of the third clock cycle of the second clock signal CLK2.

As described above with reference to FIGS. 13 and 14, the operation speed of the non-volatile memory device 5000 may be increased since the non-volatile memory device 5000 includes the pipeline circuit 200d that operates in a pipeline manner and both in a prefetch mode and an interleaving mode to output four repair data RPD1, RPD2, RPD3 and RPD4 during one period of the first clock signal CLK1 and the second clock signal CLK2.

Figure 15:
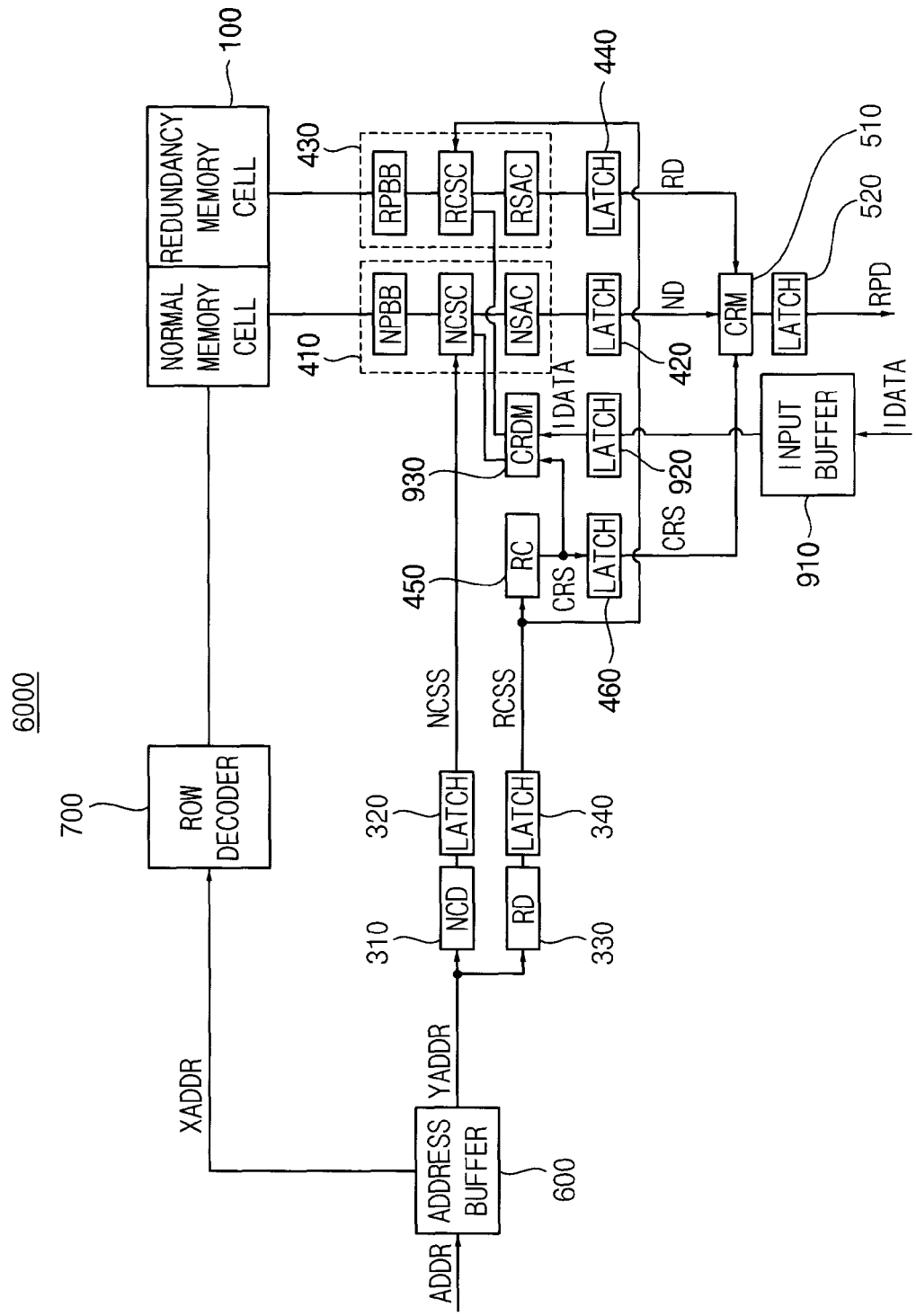
FIG. 15 is a block diagram illustrating a non-volatile memory device according to example embodiments.

FIG. 15 is a block diagram illustrating a non-volatile memory device according to example embodiments.

Referring to FIG. 15, a non-volatile memory device 6000 may further include an input buffer 910, an input latch circuit 920 and a column repair de-multiplexer CRDM 930, which are used in a writing operation, from the non-volatile memory device 2000 of FIG. 5. Hereinafter, the input buffer 910, the input latch circuit 920 and the column repair de-multiplexer 930 will be described.

The input buffer 910 may receive an input data IDATA and the address buffer 600 may receive an address ADDR, which represents a memory cell where the input data IDATA is to be written, simultaneously during the writing operation.

As described with reference to FIGS. 5 and 6, during a first clock cycle of the clock signal CLK1, the address buffer 600 may generate the column address YADDR in response to the address ADDR, the normal column decoder 310 may generate the normal column selection signal NCSS, the redundancy column decoder 330 may generate the redundancy column selection signal RCSS, the first latch circuit 320 may latch the normal column selection signal NCS and the second latch circuit 340 may latch the redundancy column selection signal RCSS. During the first clock cycle of the clock signal CLK1, the input buffer 910 may provide the input data IDATA to the input latch circuit 920 and the input latch circuit 920 may latch the input data IDATA.

During a second clock cycle of the clock signal CLK1, the repair control circuit 450 may generate the column repair signal CRS, which represents whether the column address YADDR corresponds to the normal column 101 having a defect, in response to the redundancy column selection signal RCSS received from the second latch circuit 340 to provide the column repair signal CRS to the column repair de-multiplexer 930. During the second clock cycle of the clock signal CLK1, the input latch circuit 920 may provide the input data IDATA to the column repair de-multiplexer 930. During the second clock cycle of the clock signal CLK1, the column repair de-multiplexer 930 may provide the input data IDATA to the normal column selection unit 410 or to the redundancy column selection unit 430 in response to the column repair signal CRS. For example, the column repair de-multiplexer 930 may provide the input data IDATA to the normal column selection unit 410 when the column repair signal CRS represents that the column address YADDR does not correspond to the normal column 101 having a defect, and provide the input data IDATA to the redundancy column selection unit 430 when the column repair signal CRS represents that the column address YADDR corresponds to the normal column 101 having a defect. The normal column selection unit 410 may write the input data IDATA received from the column repair de-multiplexer 930 to a normal memory cell in response to the normal column selection signal NCSS received from the first latch circuit 320. The redundancy column selection unit 430 may write the input data IDATA received from the column repair de-multiplexer 930 to a redundancy memory cell in response to the redundancy column selection signal RCSS received from the second latch circuit 340.

As described above, the non-volatile memory device 6000 may perform the writing operation in a pipeline manner.

The input buffer 910, the input latch circuit 920 and the column repair de-multiplexer 930 may be used in the non-volatile memory device 3000 of FIG. 8, the non-volatile memory device 4000 of FIG. 11 and the non-volatile memory device 5000 of FIG. 13 so that the non-volatile memory devices 3000, 4000 and 5000 may perform the writing operation in a pipeline manner.

Figure 16:
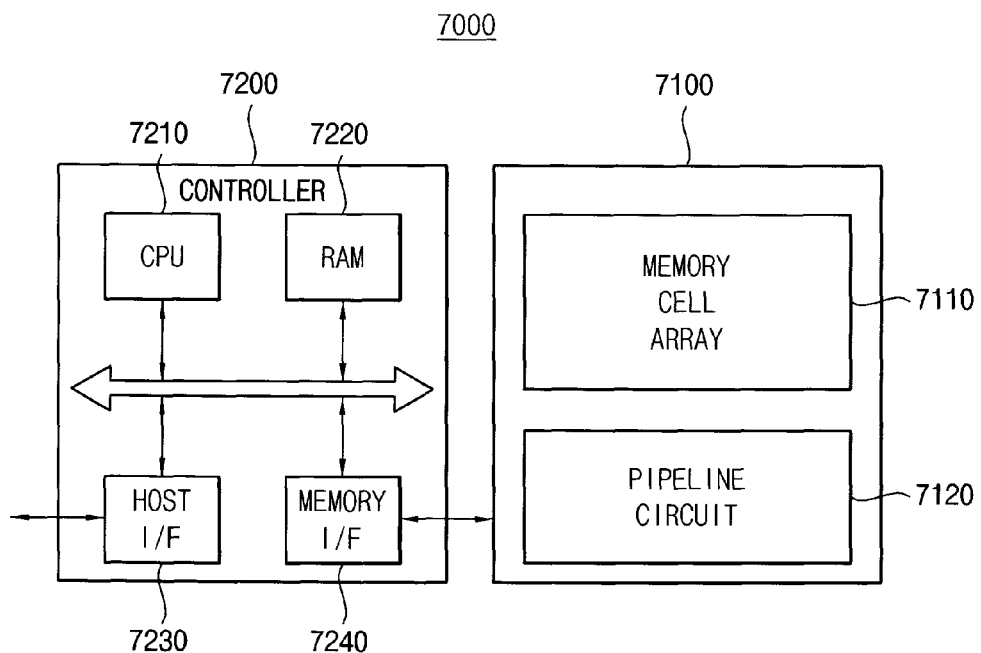
FIG. 16 is a block diagram illustrating a non-volatile memory system including a non-volatile memory device according to example embodiments.

FIG. 16 is a block diagram illustrating a non-volatile memory system including a non-volatile memory device according to example embodiments.

Referring to FIG. 16, the non-volatile memory system 7000 includes a non-volatile memory device 7100 and a memory controller 7200.

The non-volatile memory device 7100 includes a memory cell array 7110 and a pipeline circuit 7120. The memory cell array 7110 includes normal memory cells and redundancy memory cells. The pipeline circuit 7120 decodes a column address, loads data from the memory cell array 7110 in response to the column address and outputs a repair data by repairing the loaded data in a pipeline manner.

The non-volatile memory device 7100 may include one of the non-volatile memory device 2000 of FIGS. 4 and 5, the non-volatile memory device 3000 of FIGS. 7 and 8, the nonvolatile memory device 4000 of FIGS. 10 and 11, the non-volatile memory device 5000 of FIG. 13 and the non-volatile memory device 6000 of FIG. 15. Since the non-volatile memory devices 2000, 3000, 4000, 5000 and 6000 are described in detail with reference to FIGS. 1 to 15, the non-volatile memory device 7100 illustrated in FIG. 16 will be omitted.

The memory controller 7200 controls the non-volatile memory device 7100. The memory controller 7200 may control data exchanges between an external host and the non-volatile memory device 7100. The memory controller 7200 may include a central processing unit CPU 7210, a buffer memory RAM 7220, a host interface 7230 and a memory interface 7240. The central processing unit 7210 may perform operations for the data exchanges. The host interface 7230 may be connected to the external host and the memory interface 7240 may be connected to the non-volatile memory device 7100. The central processing unit 7210 may communicate with the external host via the host interface 7230. The central processing unit 7210 may control the non-volatile memory device 7100 via the memory interface 7240.

According to example embodiments, the memory controller 7200 may further include a non-volatile memory device storing a start-up code. The memory controller 7200 may further include an error correction block. The buffer memory 7220 may include dynamic random access memory (DRAM), static random access memory (SRAM), phase change random access memory (PRAM), ferroelectric random access memory (FRAM), resistive random access memory (RRAM), magnetic random access memory (MRAM), etc. The buffer memory 7220 may provide storage for operations of the central processing unit 7210.

The host interface 7230 may communicate with external devices such as the external host using various interface protocols such as universal serial bus (USB), multi-media card (MMC), peripheral component interconnect (PCI), serial advanced technology attachment (SATA), parallel advanced technology attachment (PATA), small computer system interface (SCSI), enhanced small disk interface (ESDI), integrated Drive Electronics (IDE), etc.

The non-volatile memory device 7100 and/or the memory controller 7200 may be mounted on chip using various packages such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat package (MQFP), thin quad flat package (TQFP), small outline (SOIC), shrink small outline package (SSOP), thin small outline package (TSOP), system in package (SIP), multi chip package (MCP), wafer-level fabricated package (WFP), wafer-level processed stack package (WSP), etc.

Figure 17:
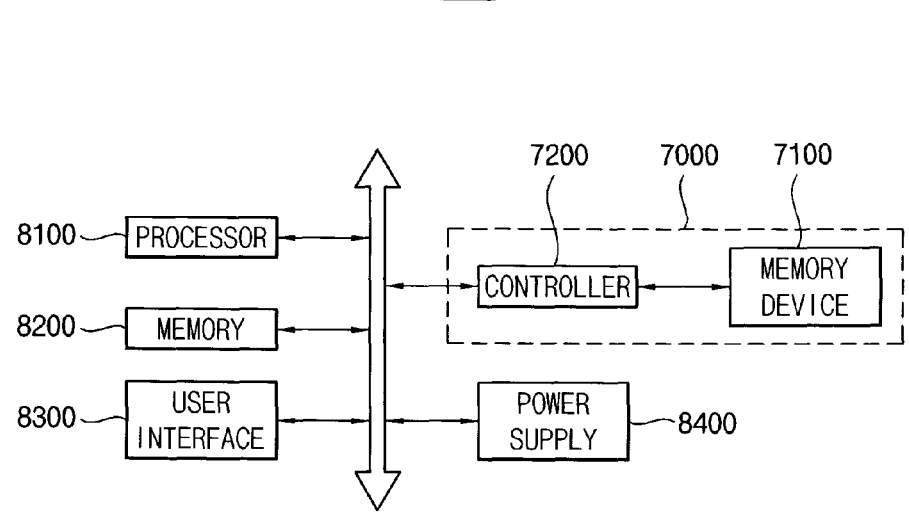
FIG. 17 is a block diagram illustrating a computing system including a non-volatile memory system according to example embodiments.

FIG. 17 is a block diagram illustrating a computing system including a non-volatile memory system according to example embodiments.

Referring to FIG. 17, a computing system 8000 includes a processor 8100, a memory device 8200, a user interface 8300 and a non-volatile memory system 7000.

The processor 8100 may perform various computing functions, such as executing specific software for performing specific calculations or tasks. For example, the processor 8100 may be a microprocessor or a central process unit. The processor 8100 may be connected to the memory device 8200 via a bus such as an address bus, a control bus or a data bus, etc. For example, the memory device 8200 may be a dynamic random access memory (DRAM), a static random access memory (SRAM), or a non-volatile memory, such as an erasable programmable read-only memory (EPROM), an electrically erasable programmable read-only memory (EEPROM), a flash memory and/or the like. The processor 8100 may be connected to an expansion bus, such as peripheral component interconnect (PCI) bus. The processor 8100 may control one or more input/output devices, such as a keyboard, a mouse, a printer, a display device, etc. The computing system 8000 may further include a storage device, such as a floppy disk drive, a compact disk read-only memory (CD-ROM) drive, a hard disk drive, etc. The processor 8100 may control the user interface 8300, which may comprise, for instance, an input device (e.g., a keyboard or a mouse), an output device (e.g., a printer or a display device) and a storage device (e.g., a hard disk drive or a compact disk read-only memory (CD-ROM)). The computing system 8000 may further include a power supply 8400 for supplying operational power. The computing system 8000 may further include an application chipset, a camera image processor (CIS), and a mobile DRAM.

The non-volatile memory system 7000 communicates with the processor 8100 via a bus. The non-volatile memory system 7000 includes a non-volatile memory device 7100 and a memory controller 7200 that control the non-volatile memory device 7100. The non-volatile memory device 7100 includes a pipeline circuit that decodes a column address, loads data from the memory cell array 7110 in response to the column address and outputs a repair data by repairing the loaded data in a pipeline manner.

The non-volatile memory system 7000 of FIG. 17 may include the non-volatile memory system 7000 of FIG. 16.

The computing system 8000 according to the example embodiments may comprise any of several types of electronic devices, such as a cellular phone, a personal digital assistant (PDA), a digital camera, a portable game console, a MP3 player, a desktop computer, a laptop (or a notebook computer), a digital speaker, a video player, a television, and many others.

Figure 18:
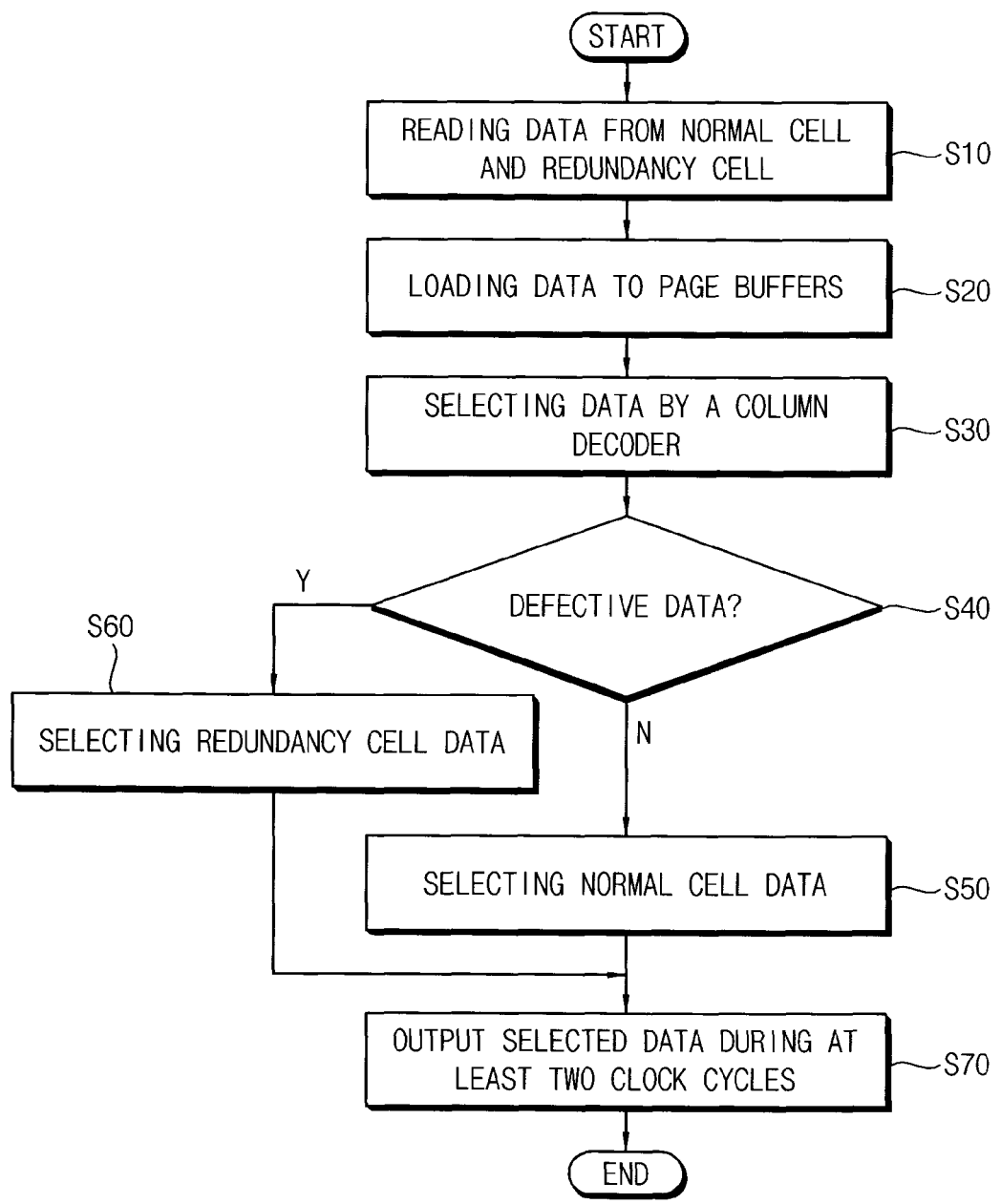
FIG. 18 is a flow chart illustrating a method of operating a memory according to example embodiments.

FIG. 18 is a flow chart showing an operating method of a memory in accordance with exemplary embodiment.

Referring to FIG. 18, the row address for selecting row is provided to both the normal cells and the redundancy cells (S10). The data from the selected normal memory cell and redundancy memory cell are loaded in page buffers (S20). The column address for selecting column is provided to a column decoder and the column decoder generates normal column selection signal and redundancy column selection signal to select loaded data from the page buffers (S30). When it is determined that the selected column address corresponds to a non defective location of the normal memory cells (S40), the repair control circuit selects the normal cell data (S50). On the other hand, when it is determined that the selected column address corresponds to a defective location of the normal memory cells (S40), the repair control circuit selects the redundancy cell data (S60). The multiplexer transmits the selected data between the normal cell data and the redundancy cell data sequentially during at two consecutive clock cycles of an internal clock signal (S70). The method may also comprise one or more operations of any of the embodiments described herein.

As described above, the operation speeds of the non-volatile memory device and the non-volatile memory system including the non-volatile memory device according to the example embodiments are increased since the non-volatile memory device and the non-volatile memory system including the non-volatile memory device operate in a pipeline manner and selectively in a prefetch mode and/or an interleaving mode.

The foregoing is illustrative of the present inventive concept and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A non-volatile memory device, comprising:
    a memory cell array including normal memory cells and redundancy memory cells, the normal memory cells and the redundancy memory cells being arranged in rows and in columns and coupled to normal bit lines and redundancy bit lines, respectively;
    a row decoder configured to select a row including a first set of the normal memory cells and a first set of the redundancy memory cells in response to a first row address;
    a page buffer configured to load normal data through the corresponding normal bit lines from the selected first set of the normal memory cells, and to load redundancy data through the corresponding redundancy bit lines from the selected first set of redundancy memory cells;
    a column decoder configured to generate a normal column selection signal and a redundancy column selection signal in response to a first column address;
    a repair control circuit configured to generate a column repair signal in response to the redundancy column selection signal;
    a column selection circuit configured to select normal data and redundancy data from the page buffer in response to the normal column selection signal and the redundancy column selection signal, respectively; and
    a repair circuit configured to receive the selected normal data and selected redundancy data at first and second inputs, respectively, and to output one of the selected normal data and the selected redundancy data during at least two consecutive clock cycles of an internal clock signal in response to the column repair signal,
    wherein the column decoder, the column selection circuit and the repair circuit are configured to operate simultaneously, each being responsive to a different column address at any one time.

2. The non-volatile memory device of claim 1, wherein the column decoder includes:
    a normal column decoder configured to generate the normal column selection signal in response to a received column address; and
    a repair detection circuit configured to generate the redundancy column selection signal when the received column address corresponds to a normal column having a defect.

3. The non-volatile memory device of claim 2, wherein the repair detection circuit includes a plurality of fuses to store an address of the normal column having a defect by selectively cutting the plurality of fuses.

4. The non-volatile memory device of claim 2, wherein the repair control circuit includes a latch circuit configured to latch the column repair signal.

5. The non-volatile memory device of claim 1, wherein the page buffer includes:
    a normal page buffer configured to load the normal data; and
    a redundancy page buffer configured to load the redundancy data.

6. The non-volatile memory device of claim 5, wherein the column selection circuit includes:
    a normal column selection circuit configured to select data provided from the normal page buffer in response to the normal column selection signal and provides selected normal data;
    a second latch circuit configured to latch the selected normal data;
    a redundancy column selection circuit configured to select data provided from the redundancy page buffer in response to the redundancy column selection signal and provides selected redundancy data; and
    a third latch circuit configured to latch the selected redundancy data.

7. The non-volatile memory device of claim 6, wherein the repair circuit includes:
    a column repair multiplexer configured to receive the selected normal data and the selected redundancy data, and to output one of the selected normal data and the selected redundancy data in response to the column repair signal; and
    a fourth latch circuit configured to latch the output data.

8. A non-volatile memory device, comprising:
    a memory cell array including normal memory cells and redundancy memory cells, the normal memory cells and the redundancy memory cells being arranged in a plurality of memory banks, and being coupled to normal bit lines and redundancy bit lines, respectively;
    a page buffer configured to load a first set of normal data through the corresponding normal bit lines from the selected first set of the normal memory cells in response to a first row address, and configured to load a first set of redundancy data through the corresponding redundancy bit lines from the selected first set of redundancy memory cells in response to the first row address;
    a column decoder configured to generate a first set of normal column selection signals and a first set of redundancy column selection signals in response to a first set of column addresses;
    a repair control circuit configured to generate a first set of column repair signals in response to the first set of redundancy column selection signals;
    a column selection circuit configured to select a first set of normal data and a first set of redundancy data from the page buffer in response to the first set of normal column selection signals and the first set of redundancy column selection signals, respectively; and
    a repair circuit configured to receive the selected first set of normal data at a first input and the selected first set of redundancy data at a second input, and configured to output a first set of output data selected between the selected first set of normal data and the selected first set of redundancy data sequentially during at least two consecutive clock cycles of an internal clock signal in response to the first set of column repair signals,
    wherein the column decoder, the column selection circuit and the repair circuit are configured to operate simultaneously, each being responsive to a different column address at any one time.

9. The non-volatile memory device of claim 8, wherein the repair circuit is configured to output the first set of output data as at least two consecutive data elements at each of at least two consecutive clock cycles of the internal clock signal.

10. The non-volatile memory device of claim 9, wherein the two consecutive data elements correspond to two successive column addresses.

11. The non-volatile memory device of claim 8,
wherein the repair circuit is configured to output a first part of the first set of output data sequentially over at least two consecutive clock cycles in response to a first internal clock signal,
wherein the repair circuit is configured to output a second part of the first set of output data sequentially over at least two consecutive clock cycles in response to a second internal clock signal, and
wherein the first and second internal clock signals are 180° out of phase with each other.

12. The non-volatile memory device of claim 11,
wherein the repair circuit is configured to output each of the first and second parts of the first set of output data as at least two sequentially output elements, and
wherein the elements of the first part of the first set of output data are output in an interleaved fashion by the repair circuit with respect to the elements of the second part of the first set of output data.

13. The non-volatile memory device of claim 11, wherein the repair circuit is configured to output each of the first and second parts of the first set of output data as at least two sequentially output elements, and wherein the elements of the first part of the first set of output data are output by the repair circuit sequentially prior to any of the elements of the second part of the first set of output data being output by the repair circuit.

14. The non-volatile memory device of claim 13, wherein the first part of the first set of output data corresponds to a first column address, and the second part of the first set of output data corresponds to a second column address.

15. A non-volatile memory system, comprising:
the non-volatile memory device of claim 8; and
a memory controller configured to control the non-volatile memory device.

16. A computing system, comprising:
the non-volatile memory system of claim 15; and
a processor configured to communicate with the non-volatile memory system via a bus.

17. A method of operating a memory, comprising:
receiving a first row address;
in response to the received first row address, reading first data from a first row of memory cells, the first data including data from normal memory cells and redundant memory cells of the first row of memory;
latching the first data in a page buffer;
at a first clock cycle of an internet clock signal,
receiving a first column address and determining whether the first column address corresponds to a defective location of the normal memory cells; at a second clock cycle of the internet clock signal,
receiving a second column address and determining whether the second column address corresponds to a defective location of the normal memory cells,
transmitting a first part of the first data from the page buffer in response to the first column address, and
transmitting a second part of the first data from the page buffer when it is determined that the first column address corresponds to a defective location of the normal memory cells, the second part of the first data corresponding to data read from the redundant memory cells; and
at a third clock cycle of the internet clock signal,
receiving a third column address and determining whether the third column address corresponds to a defective location of the normal memory cells,
transmitting a third part of the first data from the page buffer in response to the second column address,
transmitting a fourth part of the first data from the page buffer when it is determined that the second column address corresponds to a defective location of the normal memory cells, the fourth part of the first data corresponds to data read from the redundant memory cells,
selecting the first part of the first data and transmitting the first part of the first data, and
selecting the second part of the first data and transmitting the second part of the first data when it is determined that the first column address corresponds to a defective location of the normal memory cells,
wherein receiving the third column address, transmitting the third part or the fourth part of the data, and selecting the first part of the second part of the first data occur simultaneously during one clock cycle.

18. The method of claim 17, wherein the first column address is received from a source external to the memory.

19. The method of claim 17, wherein the internal clock signal is generated by receiving a clock source external to the memory.

20. A non-volatile memory device, comprising:
a memory cell array including normal memory cells and redundancy memory cells, the normal memory cells and the redundancy memory cells being arranged in rows and in columns and coupled to normal bit lines and redundancy bit lines, respectively;
a row decoder configured to select a row including a first set of the normal memory cells and a first set of the redundancy memory cells in response to a first row address;
a page buffer configured to load normal data through the corresponding normal bit lines from the selected first set of the normal memory cells, and to load redundancy data through the corresponding redundancy bit lines from the selected first set of redundancy memory cells;
a column decoder configured to generate a normal column selection signal and a redundancy column selection signal in response to a first column address;
a repair control circuit configured to generate a column repair signal in response to the redundancy column selection signal;
a column selection circuit configured to select normal data and redundancy data from the page buffer in response to the normal column selection signal and the redundancy column selection signal, respectively; and
a repair circuit configured to receive the selected normal data and selected redundancy data at first and second inputs, respectively, and to output one of the selected normal data and the selected redundancy data during at least two consecutive clock cycles of an internal clock signal in response to the column repair signal,
wherein the column decoder includes:
a normal column decoder configured to generate the normal column selection signal in response to a received column address; and
a repair detection circuit configured to generate the redundancy column selection signal when the received column address corresponds to a normal column having a defect, wherein the repair detection circuit includes a plurality of fuses to store an address of the normal column having a defect by selectively cutting the plurality of fuses.

21. A non-volatile memory device, comprising:
a memory cell array including normal memory cells and redundancy memory cells, the normal memory cells and the redundancy memory cells being arranged in rows and in columns and coupled to normal bit lines and redundancy bit lines, respectively;
a row decoder configured to select a row including a first set of the normal memory cells and a first set of the redundancy memory cells in response to a first row address;
a page buffer configured to load normal data through the corresponding normal bit lines from the selected first set of the normal memory cells, and to load redundancy data through the corresponding redundancy bit lines from the selected first set of redundancy memory cells;
a column decoder configured to generate a normal column selection signal and a redundancy column selection signal in response to a first column address;
a repair control circuit configured to generate a column repair signal in response to the redundancy column selection signal;
a column selection circuit configured to select normal data and redundancy data from the page buffer in response to the normal column selection signal and the redundancy column selection signal, respectively; and
a repair circuit configured to receive the selected normal data and selected redundancy data at first and second inputs, respectively, and to output one of the selected normal data and the selected redundancy data during at least two consecutive clock cycles of an internal clock signal in response to the column repair signal,
wherein the page buffer includes:
a normal page buffer configured to load the normal data; and
a redundancy page buffer configured to load the redundancy data, and
wherein the column selection circuit includes:
a normal column selection circuit configured to select data provided from the normal page buffer in response to the normal column selection signal and provides selected normal data;
a second latch circuit configured to latch the selected normal data;
a redundancy column selection circuit configured to select data provided from the redundancy page buffer in response to the redundancy column selection signal and provides selected redundancy data; and
a third latch circuit configured to latch the selected redundancy data.

22. A non-volatile memory device, comprising:
a memory cell array including normal memory cells and redundancy memory cells, the normal memory cells and the redundancy memory cells being arranged in rows and in columns and coupled to normal bit lines and redundancy bit lines, respectively;
a row decoder configured to select a row including a first set of the normal memory cells and a first set of the redundancy memory cells in response to a first row address;
a page buffer configured to load normal data through the corresponding normal bit lines from the selected first set of the normal memory cells, and to load redundancy data through the corresponding redundancy bit lines from the selected first set of redundancy memory cells;
a column decoder including a first latch circuit, the column decoder configured to generate and latch a normal column selection signal and a redundancy column selection signal in response to a first column address;
a repair control circuit configured to generate a column repair signal in response to the redundancy column selection signal;
a column selection circuit including a second latch circuit, the column selection circuit configured to select and latch normal data and redundancy data from the page buffer; and
a repair circuit including a third latch circuit, the repair circuit configured to receive and latch the selected normal data and redundancy data output by the column selection circuit at first and second inputs, respectively, and to output one of the selected normal data and the redundancy data during at least two consecutive clock cycles of an internal clock signal in response to the column repair signal.

* * * * *